(12) United States Patent
Loh et al.

(10) Patent No.: US 10,204,201 B1
(45) Date of Patent: Feb. 12, 2019

(54) METHODS, SYSTEMS, AND ARTICLES OF MANUFACTURE FOR VERIFYING AN ELECTRONIC DESIGN USING HIERARCHICAL CLOCK DOMAIN CROSSING VERIFICATION TECHNIQUES

(71) Applicant: Cadence Design Systems, Inc., San Jose, CA (US)

(72) Inventors: Lawrence Loh, Milpitas, CA (US); Artur Melo Mota Costa, Belo Horizonte (BR); Breno Rodrigues Guimaraes, Belo Horizonte (BR); Fabiano Peixoto, Belo Horizonte (BR); Andrea Iabrudi Tavares, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/199,059

(22) Filed: Jun. 30, 2016

(51) Int. Cl.
*G06F 17/50* (2006.01)

(52) U.S. Cl.
CPC ...... *G06F 17/5045* (2013.01); *G06F 17/5031* (2013.01); *G06F 2217/62* (2013.01)

(58) Field of Classification Search
CPC .................. G06F 17/5045; G06F 17/5031
USPC .................................................. 716/108
See application file for complete search history.

(56) References Cited

U.S. PATENT DOCUMENTS

| | | | |
|---|---|---|---|
| 7,159,198 B1 | 1/2007 | Ip et al. | |
| 7,237,208 B1 | 6/2007 | Ip et al. | |
| 7,418,678 B1 | 8/2008 | Ip et al. | |
| 7,437,694 B1 | 10/2008 | Loh et al. | |
| 7,523,424 B2 * | 4/2009 | Kolpekwar | G06F 17/5036 716/103 |
| 7,647,572 B1 | 1/2010 | Ip et al. | |
| 8,381,148 B1 | 2/2013 | Loh et al. | |
| 8,572,527 B1 | 10/2013 | Coelho et al. | |
| 8,661,383 B1 * | 2/2014 | Dobkin | G06F 17/5081 716/102 |
| 8,683,419 B1 * | 3/2014 | Hines | G06F 17/505 716/109 |
| 8,731,894 B1 | 5/2014 | Kranen et al. | |
| 8,831,925 B1 | 9/2014 | Kranen et al. | |
| 8,863,049 B1 | 10/2014 | Lundgren et al. | |
| 8,954,904 B1 | 2/2015 | Loh et al. | |

(Continued)

OTHER PUBLICATIONS

"Clock Domain Crossing", URL: https://filebox.ece.vt.edu/~athanas/4514/ledadoc/html/pol_cdc.html, Dec. 2009.

*Primary Examiner* — Suchin Parihar
(74) *Attorney, Agent, or Firm* — Vista IP Law Group, LLP

(57) ABSTRACT

Disclosed are techniques for verifying an electronic design using hierarchical clock domain crossing verification techniques. These techniques identify an electronic design including a top hierarchy and one or more instances at a first child hierarchy below the top hierarchy. The electronic design may be decomposed into a top hierarchy block for the top hierarchy and one or more child blocks for the one or more instances. A plurality of data structures may be generated by separately processing the top hierarchy block and the one or more child blocks on one or more computing nodes. One or more clock domain crossing structures may be identified in the electronic design at least by integrating the plurality of data structures.

21 Claims, 18 Drawing Sheets

(56) References Cited

U.S. PATENT DOCUMENTS

| | | | |
|---|---|---|---|
| 9,104,824 B1 | 8/2015 | Loh et al. | |
| 9,449,196 B1 | 9/2016 | Purri et al. | |
| 9,633,151 B1 | 4/2017 | Sun et al. | |
| 9,721,057 B2* | 8/2017 | Ganai | G06F 17/5081 |
| 2005/0229123 A1* | 10/2005 | Wang | G01R 31/31704 |
| | | | 716/103 |
| 2005/0268265 A1* | 12/2005 | Ly | G06F 17/5022 |
| | | | 716/108 |
| 2007/0079167 A1* | 4/2007 | Lemos | G06F 13/4059 |
| | | | 713/600 |
| 2007/0124706 A1* | 5/2007 | Kolpekwar | G06F 17/5036 |
| | | | 716/102 |
| 2009/0064071 A1* | 3/2009 | Siarkowski | G06F 17/5031 |
| | | | 716/113 |
| 2010/0242003 A1* | 9/2010 | Kwok | G06F 17/504 |
| | | | 716/106 |
| 2012/0042294 A1* | 2/2012 | Sarwary | G06F 17/5031 |
| | | | 716/108 |
| 2015/0161315 A1* | 6/2015 | Meil | G06F 17/5031 |
| | | | 716/108 |
| 2016/0224710 A1* | 8/2016 | Dua | G06F 17/5045 |
| 2016/0259879 A1* | 9/2016 | Ganai | G06F 17/5081 |
| 2016/0283628 A1 | 9/2016 | Peixoto et al. | |
| 2017/0364620 A1* | 12/2017 | Meil | G06F 17/5031 |

\* cited by examiner

| TOP HIERARCHY 400A | | | |
|---|---|---|---|
| SIGNAL | DRIVER | CLOCK DOMAIN | INFO. SOURCE |
| 412A (IN1) | -- | DOMAIN A | PROVIDED |
| 416A (IN2) | -- | DOMAIN B | PROVIDED |
| 418A (CLOAK) | -- | DOMAIN A | PROVIDED |
| 414A (CLUBS) | -- | DOMAIN B | PROVIDED |
| 404A1 (INA1) | 402A OUTPUT (FLOP1) | DOMAIN B | DRIVING REGISTER |
| 404A2 (INA2) | 414A (IN2) | DOMAIN B | DRIVING PRIMARY INPUT |
| 406A1 (INB1) | 404A3 (OUTA1) | SAME AS 404A3 | |
| 406A2 (INB2) | 408A2 (OUTC1) | SAME AS 408A2 | |
| 408A1 (INC1) | 406A3 (OUTB1) | SAME AS 406A3 | |
| 402A (FLOP1) | 412A (IN1) | DOMAIN B | FLOP – CLOCK ANALYSIS |
| 410A (FLOP2) | 406A4 (OUTB2) | DOMAIN A | FLOP – CLOCK ANALYSIS |
| 450A (OUT1) | 410A OUTPUT (FLOP2) | DOMAIN A | DRIVING REGISTER |

FIG. 4B

TABLE 1

| Block 404A | | | |
|---|---|---|---|
| Signal | Driver | Clock Domain | Info. Source |
| 404A1 (InA1) | -- | Domain B | Top Hierarchy |
| 404A2 (InA2) | -- | Domain B | Top Hierarchy |
| 404A3 (OutA1) | 404A1 (InA1) | Domain B | Driving Primary Input |

Table 2

| BLOCK 406A | | | |
|---|---|---|---|
| SIGNAL | DRIVER | CLOCK DOMAIN | INFO. SOURCE |
| 406A1 – INB1 | -- | INB1 – SPECULATIVE | SPECULATION |
| 406A2 – INB2 | -- | INB1 – SPECULATIVE | SPECULATION |
| 406A3 – OUTB1 | 406A1 - INB1 | SAME AS 406A1 | DRIVING INPUT |
| 406A4 – OUTB2 | 406A2 – INB2 | SAME AS 406A2 | DRIVING INPUT |

TABLE 3

| Block 408A | | | |
|---|---|---|---|
| Signal | Driver | Clock Domain | Info. Source |
| 408A1 (InC1) | — | 408A1 (InC1) Speculative | Speculation |
| 408A2 (OutC1) | 408A1 (InC1) | Same as 408A1 (InC1) | Derive from Driving the Input |

TABLE 4

| TOP HIERARCHY 400A |||| 
|---|---|---|---|
| SIGNAL | DRIVER | CLOCK DOMAIN | INFO. SOURCE |
| 412A (IN1) | -- | DOMAIN A | PROVIDED |
| 414A (IN2) | -- | DOMAIN B | PROVIDED |
| 418A (CLOAK) | -- | CLOCK SIGNAL | PROVIDED |
| 414A (CLUBS) | -- | CLOCK SIGNAL | PROVIDED |
| 404A1 (INA1) | 402A (F1) | DOMAIN B | DRV. REG. |
| 404A2 (INA2) | 416A (IN2) | DOMAIN B | DRV. PRY. INPUT |
| 404A3 (OUTA1) | 404A (INA1) | DOMAIN B | DRV. PRY. INPUT |
| 406A1 (INB1) | 404A1 (OUTA1) | DOMAIN B | |
| 406A2 (INB2) | 408A2 (OUTC1) | DOMAIN B | |
| 406A3 (OUTB1) | 406A1 (INB1) | DOMAIN B | DRV. PRY. INPUT |
| 406A4 (OUTB2) | 406A2 (INB2) | DOMAIN B | DRV. PRY. INPUT |
| 408A1 (INC1) | 406A3 (OUTB1) | DOMAIN B | |
| 408A2 (OUTC1) | 408A1 (INC1) | DOMAIN B | DRV. PRY. INPUT |
| 402A (FLOP1) | 412A (IN1) | DOMAIN B | FLOP – CLOCK ANALYSIS |
| 410A (FLOP2) | 406A4 (OUTB2) | DOMAIN A | FLOP – CLOCK ANALYSIS |
| 450A (OUT1) | 410A (FLOP2) | DOMAIN A | DRV. REG. |

FIG. 4F
TABLE 5

METHODS, SYSTEMS, AND ARTICLES OF MANUFACTURE FOR VERIFYING AN ELECTRONIC DESIGN USING HIERARCHICAL CLOCK DOMAIN CROSSING VERIFICATION TECHNIQUES

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic design automation (EDA) tools are devised to communicate design intent and the circuit behavior between a circuit designer and other technical personnel such as design team member. With the number of transistors in an integrated circuit (IC) doubling approximately every two years according to the Moore's law, contemporary electronic designs have become increasingly bigger and more complex over time. These contemporary electronic designs continue to face increasing size and complexity challenges as well as the employment of multiple asynchronous clock domains for different input/output (I/O) interfaces.

An electronic design having clock domain crossing violations is a circuit design that has one clock asynchronous to or has a variable phase relation with another clock. A clock domain crossing (CDC) signal may thus include a signal latched by a flip-flop (FF) in one clock domain and sampled in another asynchronous clock domain. Transferring signals between asynchronous clock domains may lead to setup or timing violations that may further cause signals to become meta-stable. Conventional approaches often address and verify such CDC errors late in the design cycles or even in the post-silicon verification.

The identification and fixes of CDC errors thus impose prohibitively high costs. In addition, these conventional approaches involve multiple techniques to identify CDC violations and CDC structures causing these CDC violations. These techniques require identifying the hardware description of an electronic design, elaborating and analyzing the representation of the electronic design (e.g., a full system on chip also known as SoC) in its entirety to generate a netlist model, and performing various analyses to identify possible CDC issues in the netlist model. Nonetheless, the sheer size of the electronic design not only requires a powerful computing system to manipulate the electronic design in its entirety but also crumbles the performance of such a computing system to a point that many modern computing systems simply cannot even handle the elaboration part, not to mention the subsequent analyses.

Therefore, there exists a need for a method, system, and computer program product for verifying an electronic design using hierarchical clock domain crossing verification techniques.

SUMMARY

Disclosed are method(s), system(s), and article(s) of manufacture for verifying an electronic design using hierarchical clock domain crossing verification techniques in various embodiments. Some first embodiments are directed at a method for verifying an electronic design using hierarchical clock domain crossing verification techniques. In these embodiments, an electronic design including a top hierarchy and one or more instances at a first child hierarchy below the top hierarchy may be identified. The electronic design may be decomposed into a top hierarchy block for the top hierarchy and one or more child blocks for the one or more instances. The top hierarchy block and the one or more child blocks are separately processed on one or more computing nodes. A plurality of data structures may be generated from separately processing the top hierarchy block and the one or more child blocks on one or more computing nodes. One or more clock domain crossing structures may be identified in the electronic design at least by integrating the plurality of data structures into an integrated data structure representing the electronic design.

Some embodiments are directed at a hardware module or system that may be invoked to perform any of the methods, processes, or sub-processes disclosed herein. The hardware system may include one or more hardware modules that by themselves or in conjunction with one or more other hardware components, one or more software modules, or a combination of one or more hardware components and one or more software modules of one or more computing systems to execute a sequence of instruction to perform various acts such as the performance of identification, determination, hierarchical synthesis, data forwarding, data aggregation, data generation, formal verification tasks, black-boxing, etc. Some illustrative modules or components of the hardware system may be found in the System Architecture Overview section and the description of FIGS. 1A-1B below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for verifying an electronic design using hierarchical clock domain crossing verification techniques are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above may be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 4A-4F jointly illustrate an example of the application of various techniques to an example of an electronic design and examples of outputs in one or more embodiments.

DETAILED DESCRIPTION

Figure 1A:
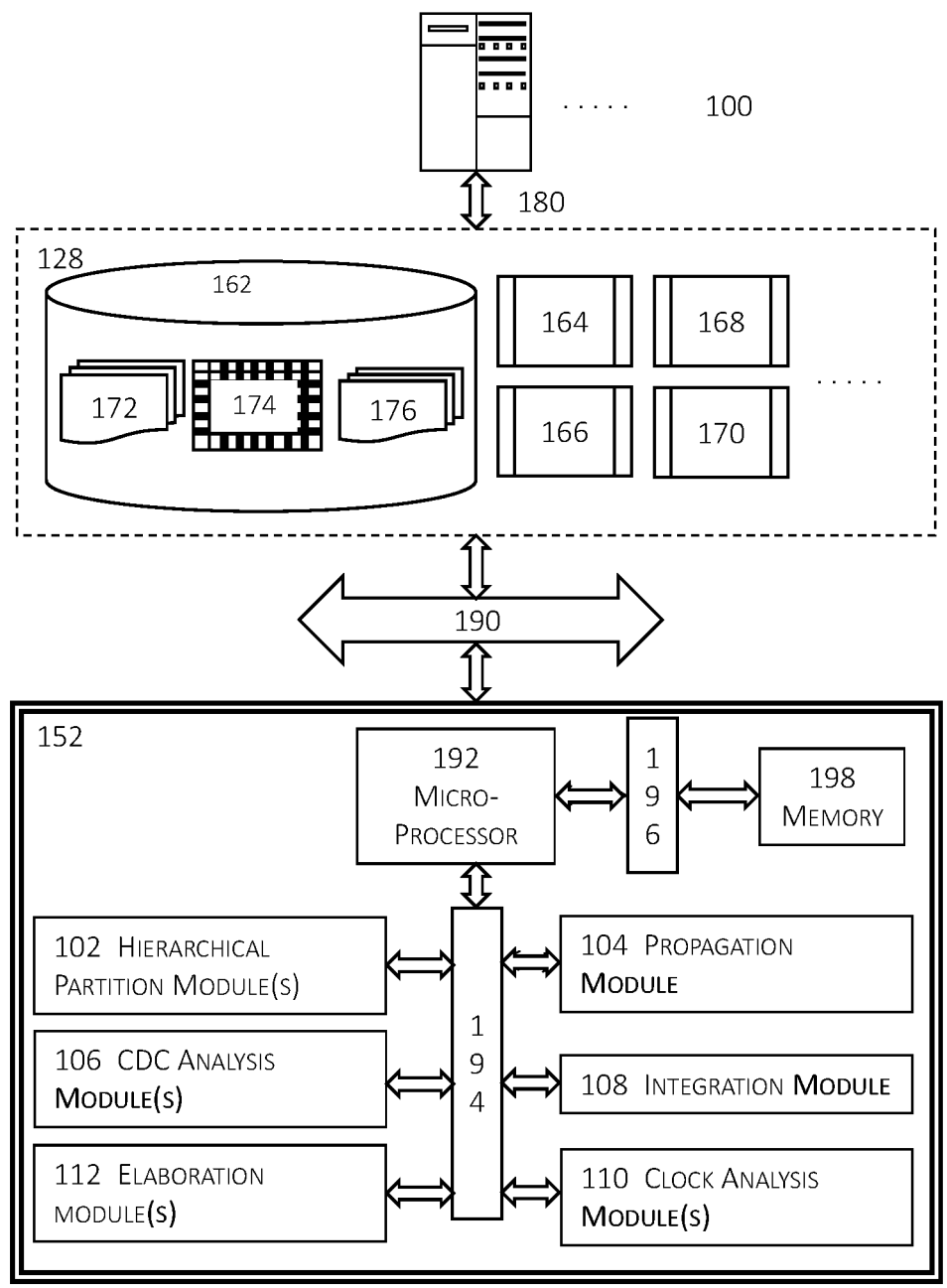
FIG. 1A illustrates a high level schematic block diagram for verifying an electronic design using hierarchical clock domain crossing verification techniques in one or more embodiments.

Various embodiments are directed to a method, system, and computer program product for verifying an electronic design using hierarchical clock domain crossing verification techniques. Other objects, features, and advantages of the invention are described in the detailed description, figures, and claims.

When verifying an electronic design, various techniques described herein identify the top hierarchy including a plurality of blocks or cells (collectively blocks) and discrete circuit components. To avoid elaborating an electronic design in its entirety, the electronic design may be hierarchically decomposed into multiple blocks or portions (collectively block for singular or blocks for plural), each of which may be separately elaborated and analyzed either sequentially on a single computing node or in parallel on multiple computing nodes in a parallel or distributed computing paradigm. For example, an electronic design may be hierarchically decomposed into the top hierarchy and a plurality of blocks under the top hierarchy.

The top hierarchy may be separately elaborated while black-boxing the plurality of blocks under the top hierarchy. One or more analyses (e.g., a structural analysis, a functional analysis, a clock analysis, or any combinations thereof) may be performed on the elaborated top hierarchy to determine the connectivity or topology information among the plurality of blocks and the discrete circuit components in the top hierarchy. With the clock information (e.g., clock domain information) provided for the input signals in the top hierarchy, propagated clock information may be determined by driving or propagating these input signals to signals that are connected directly or indirectly via one or more discrete circuit components (e.g., a combinational logic in the top hierarchy) to the input signals.

Based in part or in whole on the analysis, structures where two signals having different clock domain converge (e.g., two signals having asynchronous clock domains converge at one circuit component), where a signal crosses from one clock domain to another clock domain (e.g., a signal latched by a flip-flop in one clock domain and sampled in another asynchronous clock domain), or where a signal has a variable phase relation with another signal may be identified as potential clock domain crossing (CDC) structures. Transferring a signal between asynchronous clock domains may lead to setup or hold timing violations of flip-flops and may cause the signal to be meta-stable. These CDC structures may thus need to be addressed or fixed to avoid such violations. The connectivity or topology information, the clock domain information, the propagated clock information, and references to those potential CDC structures may be stored in a data structure for the top hierarchy.

One or more black-boxed blocks under the top hierarchy may also be separately elaborated and analyzed to generate the corresponding data structure for the respective connectivity or topology information and propagated clock information, without considering the other black-boxed blocks or the top hierarchy in a substantially similar manner as the top hierarchy. In some embodiments where a black-boxed block includes more than one lower hierarchy under the top hierarchy (e.g., an instance within another instance), this black-boxed block may be further decomposed into one or more sub-blocks that are separately elaborated and analyzed.

It shall be noted that although the top hierarchy or a black-boxed block may include one or more blocks at one or more lower hierarchies, not every block at the one or more lower hierarchies needs to be separately elaborated or analyzed. For example, an electronic design may be hierarchically decomposed into multiple blocks where at least one block includes multiple sub-blocks in the electronic design. In some embodiments, a block comprising one or more sub-blocks may or may not be further decomposed into multiple sub-portions. Rather, a block including one or more sub-blocks may nevertheless be elaborated and analyzed in its entirety in some embodiments.

Once these multiple blocks are separately elaborated and analyzed, the data structures for each of the separately processed multiple blocks may be integrated into an integrated data structure that stores at least the connectivity or topology information and clock domain information for the entire electronic design. The generation of this integrated data structure may be efficiently performed by merging data in the identically or similarly formatted data structures into the integrated data structure. When first created, this integrated data structure may include speculative or missing information due to the separate elaboration and analysis of each of the blocks. This integrated data structure may then be resolved or reconciled by propagating or referencing exact clock information to directly or indirectly connected signals to replace speculative clock information and to add missing information in the integrated data structure. During this resolution or reconciliation process, certain CDC structures that may potentially cause CDC violations may be determined to be harmless and may thus be ignored or discarded from subsequent consideration, analyses, or fixes to conserve computational resources.

Various embodiments of the methods, systems, and articles of manufacture will now be described in detail with reference to the drawings, which are provided as illustrative examples of the invention to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-5.

Figure 1B:
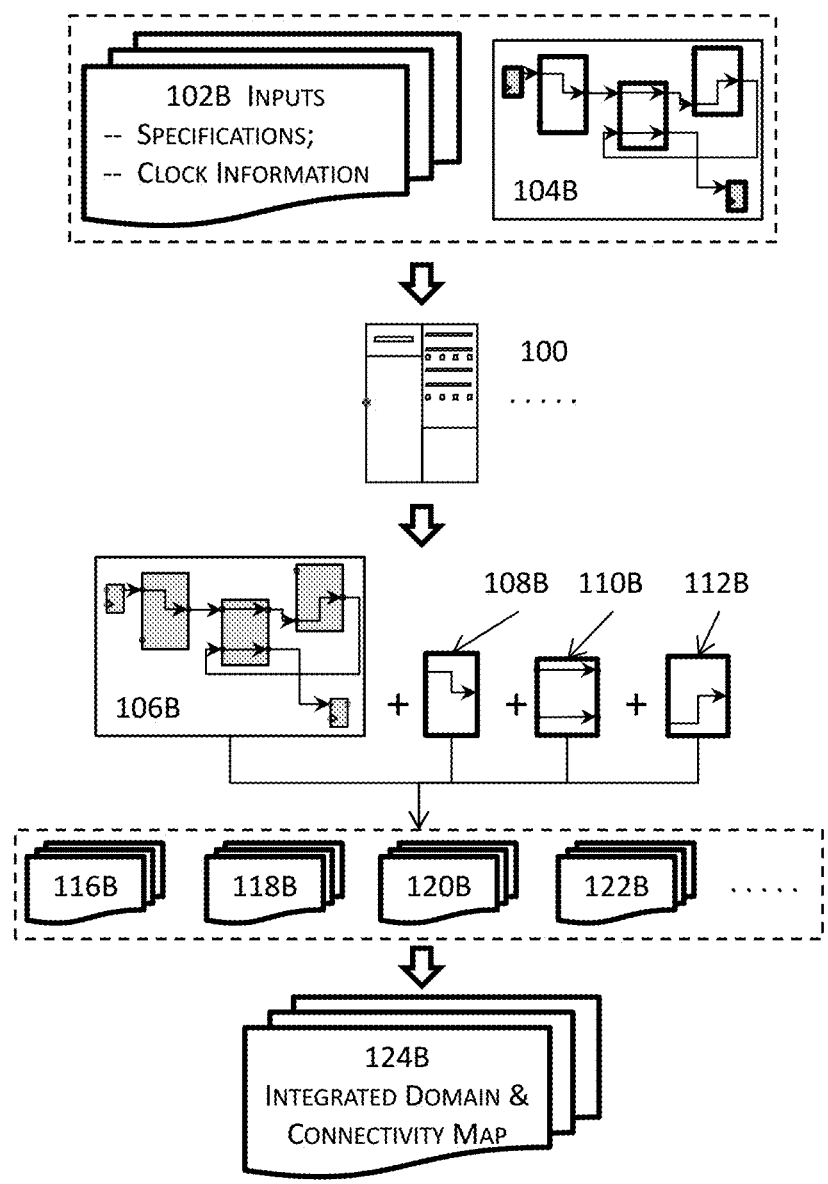
FIG. 1B illustrates another high level schematic block diagram for verifying an electronic design using hierarchical clock domain crossing verification techniques in one or more embodiments.

FIG. 1B illustrates another high level schematic block diagram for verifying an electronic design using hierarchical clock domain crossing verification techniques in one or more embodiments. One or more computing nodes 100 may receive an electronic design of interest 104B and inputs 102B that comprise, for example, one or more design specifications, clock information provided by designers or other sources, etc. These one or more computing nodes 100 may hierarchically decompose the electronic design 104B into multiple portions including the top hierarchy 106B that includes black-boxed blocks excluded from elaboration and analysis, discrete components, etc. These multiple portions may further include child portions for each of the blocks 108B, 110B, and 112B that are located are black-boxed and thus not elaborated or analyzed in the portion for the top hierarchy 106B. A child portion may include one or more sub-blocks (e.g., instances) and may be elaborated in its entirety in some embodiments or may be further hierarchically decomposed into multiple sub-portions, each of which may be separately elaborated and analyzed in some other embodiments.

Each of these multiple portions may be separately elaborated and analyzed by the one or more computing nodes 100 to generate its corresponding connectivity and clock domain information data structure. For example, data structures 116B, 118B, 120B, and 122B may be generated for the portions 106B, 108B, 110B, and 112B, respectively. A connectivity and clock domain information data structure for a portion may store information including, for example, connectivity information, exact or speculative clock domain information for various signals in the portion, drivers for at least some of the various signals, CDC information for CDC structures in the portion, or any other desired or required information, etc. More details about the exact and speculative clock domain information will be described below with reference to FIGS. 2A-2B. These multiple data structures storing respective connectivity and clock information may be integrated by at least one computing node of the one or more computing nodes 100 to create an integrated domain and connectivity data structure 124B that may be further processed by propagation of exact clock domain information or by a clock or structure analysis to identify and confirm actual CDC information and to trim some CDC information that is confirmed to be non-clock domain crossing.

Figure 2A:
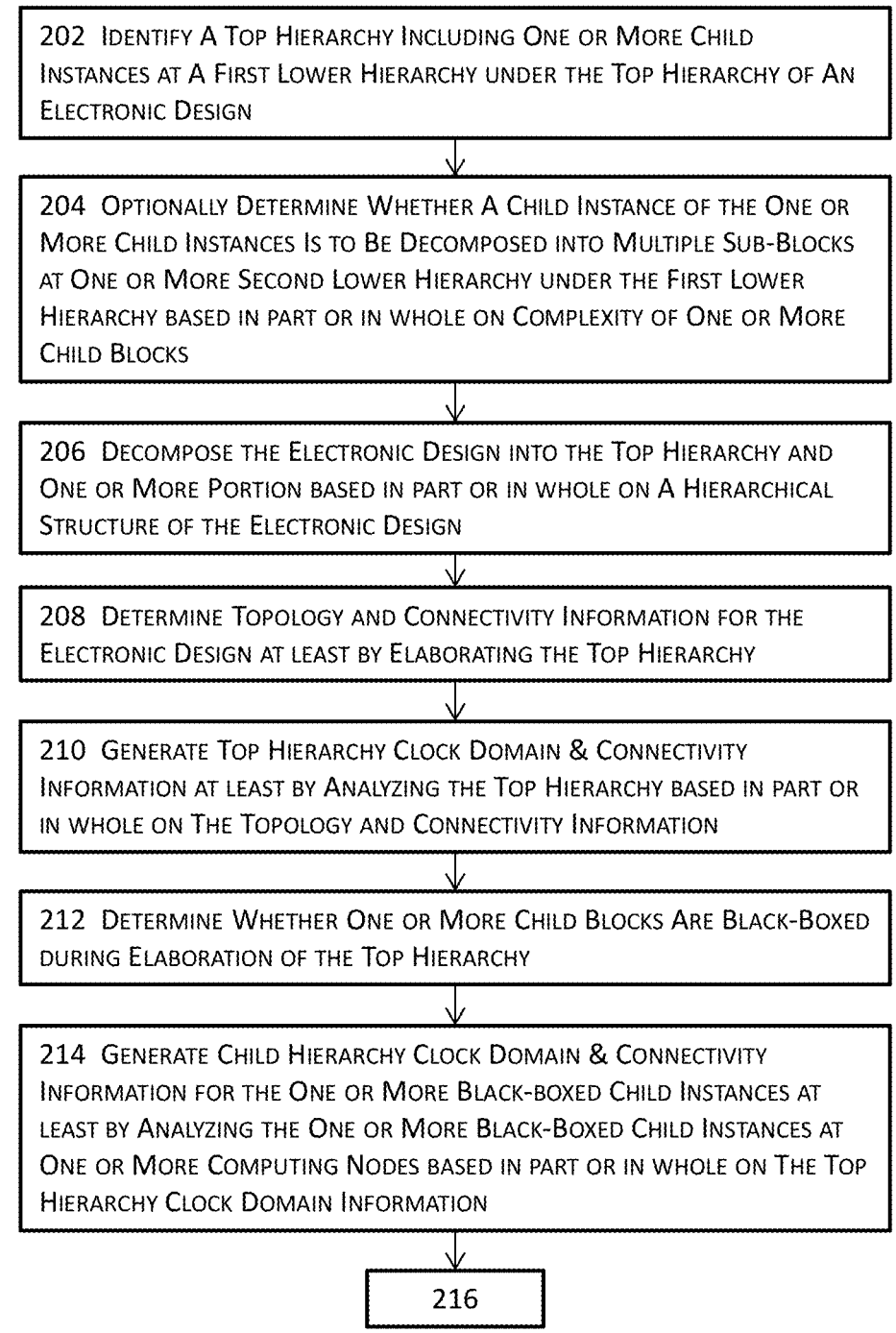
FIGS. 2A-2B jointly illustrate a high level block diagram for verifying an electronic design using hierarchical clock domain crossing verification techniques in one or more embodiments.
Figure 2B:
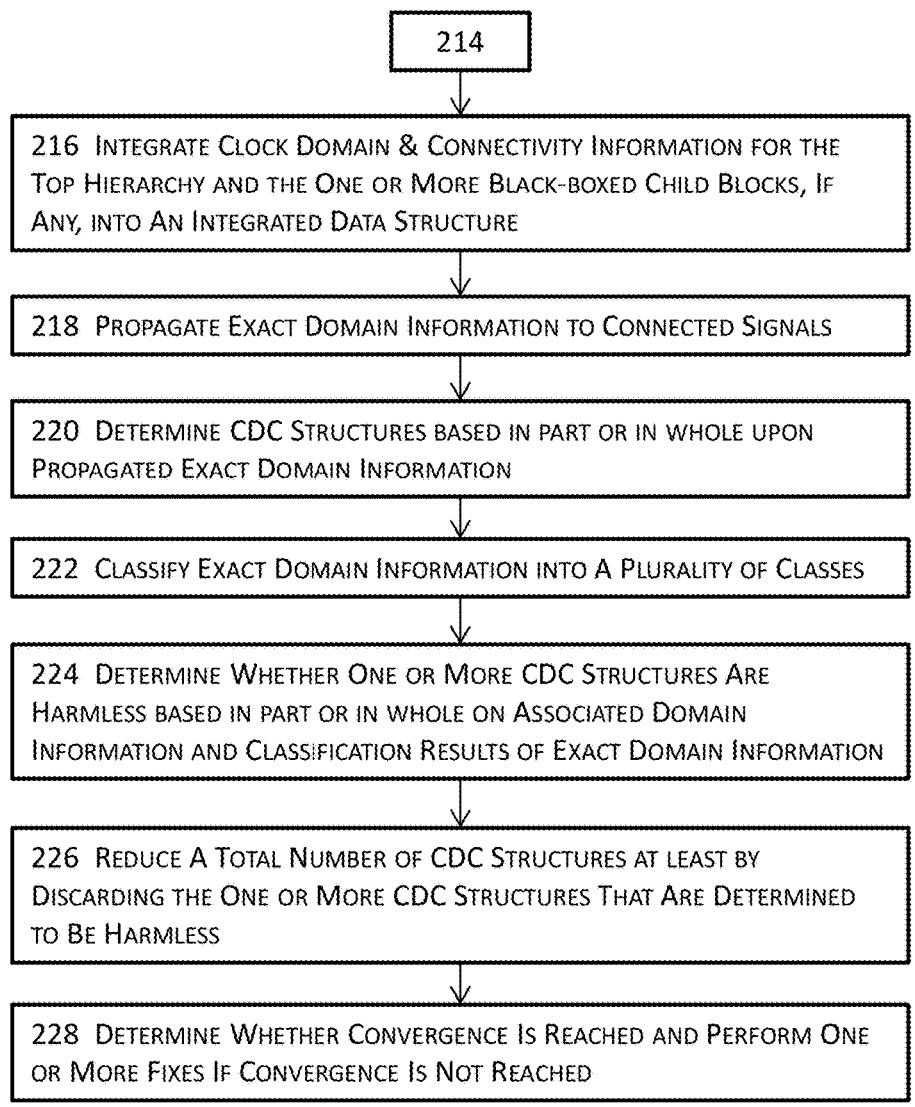

FIGS. 2A-2B jointly illustrate a high level block diagram for verifying an electronic design using hierarchical clock domain crossing verification techniques in one or more embodiments. At 202, various techniques described herein first identify a top hierarchy that includes one or more child blocks at a first lower hierarchy under the top hierarchy in an electronic design. Because the electronic design is subsequently decomposed into multiple portions that are separately processed, one or more of the child blocks may be required or desired to be further decomposed for proper load balancing when these multiple blocks are separately processed by a plurality of computing nodes in a parallel or distributed computing paradigm. An optional determination may be made at 204 to determine whether a child block is to be further decomposed into one or more sub-blocks at one or more second lower hierarchies based in part or in whole upon the complexity of the one or more child blocks. This optional determination is to ensure that a child block will not need more processing time due to its complexity when processed by a computing node so that the other computing nodes finish their processing of their respective blocks.

To avoid having to elaborate or analyze the entire electronic design, the electronic design may be decomposed at 206 into a first portion for the top hierarchy and one or more portions for the blocks, cells, or instances (collectively "block" for singular or "blocks" for plural) based in part or in whole upon the hierarchical structure of the electronic design. It shall be noted that these multiple blocks may be created by a hierarchical decomposition module in many different ways. For example, an electronic design may be hierarchically decomposed into a first portion for the top hierarchy including black-boxed blocks and discrete circuit components and a portion for each block at a first lower hierarchy under the top hierarchy in some embodiments. In some other embodiments, a portion may include more than one block at the first lower hierarchy. Even when a portion includes only a single block, the portion may be elaborated in its entirety in some embodiments or may be further decomposed into a plurality of sub-portions each of which is separately elaborated in some other embodiments.

The circuit topology and connectivity information may be determined at 208 to provide how various blocks and discrete circuit components are connected in the electronic design. Circuit topology of an electronic design includes the representation of the network of interconnections among various circuit components in the electronic design. Circuit topology is not, however, concerned with the physical layout of these circuit components. Nor is it concerned with specific values or ratings of these circuit components. Rather, circuit topology of an electronic design is concerned with what interconnections exist among various circuit components in the electronic design.

The circuit topology and connectivity information may also include identifications of pins, ports, signals, and mappings between signals and pins or ports that may be subsequently referenced during signal propagation across the hierarchical structure of the electronic design. The circuit topology and connectivity information may be determined at 208 at least by elaborating the first portion for the top hierarchy. Elaboration includes a process that expands the design description (e.g., a description of the electronic design in a Hardware Description Language or HDL) to represent all instances (e.g., Verilog instances) of all modules or entities (e.g., VHSIC Hardware Description Language or VHDL entities) into objects and to evaluate and propagate ports, constants, parameters (e.g., Verilog parameters), or generics (e.g., VHDL generics) throughout the design. On the other hand, if the circuit topology and connectivity information may be obtained from other sources such as some pre-determined design specification or previously generated results, these elaboration of the top hierarchy may be skipped to conserve computational resources including, for example, runtime and memory utilization.

Clock domain information and connectivity information for the top hierarchy may be generated at 210 at least by analyzing the portion generated at 206 for the top hierarchy based in part or in whole upon the topology and connectivity information. The clock domain and connectivity information may be stored in a data structure for the top hierarchy. An example of such a data structure for the top hierarchy is illustrated in FIG. 4B. The clock domain and connectivity information may be determined for the top hierarchy at least by performing one or more clock analyses. For example, clock domain and connectivity information may be determined at least by traversing the top hierarchy and driving the input signals to all the other signals that are directly connected to the input signals or indirectly via one or more circuit components (e.g., a combinational logic) in the top hierarchy. By driving the input signals to connected signals, the clock domains for the signals at the top hierarchy may be exactly or speculatively determined so that each signal and hence the corresponding ports and pins may be associated with the exact or speculative clock domain information. Exact clock domain information of a signal includes the clock domain for the signal, and the clock domain is exactly determined without speculations, assumptions, or unknowns.

On the other hand, if the clock domain of an input signal into a block cannot be finally or deterministically determined during a separate analysis of the block, the output signal of the flop may be speculated to be in one of one or more clock domains of one or more clock signals for the block, while the input clock domain of the input signal may be optimistically or pessimistically speculated. For example, the input clock domain may not be provided by the user or in the design specification. In this example, the output clock domain of an output signal may be determined to be the same as the clock signal. In addition, the input clock domain may be optimistically speculated to be in the same clock domain in some embodiments so that the speculation does not introduce a CDC violation although this speculated input clock domain is to be confirmed during propagation of clock domain information in the subsequent integration process. In some other embodiments, the input clock domain may be pessimistically speculated to be in a separate clock domain different from the clock domain of the clock signal. This speculation introduces and thus identifies this block as a potential CDC violation that will also be confirmed during clock domain information propagation.

Speculative clock domain information needs subsequent confirmation via clock domain information propagation and/or one or more further clock analyses. In the aforementioned example, the clock domain information of another block or signal that drives the input signal of the block may be propagated to determine whether the clock domain for the input signal may be ascertained. If so, the speculative clock domain information for both the input signal and the output signal may be ascertained. It shall be noted that a block described herein may be clocked by one or more clock signals that may belong to one or more respective clock domains, and that the recitation of a singular clock signal or a singular clock domain for a block does not explicitly or implicitly infer that the block is clocked by only a single clock signal.

To ensure the one-pass logic analysis to ascertain clock domain information without repeated or iterative analyses across, a clock analysis may be performed during the elaboration and analysis of the block or module to identify the presence of proper clock synchronizers or synchronization circuit (hereinafter synchronizer). When a proper clock synchronizer (e.g., a synchronization circuit without convergence of synchronized signals or without improper synchronization protocols, etc.) is present in a block or module, the clock domain information for a signal connected to the synchronizer in the block or module may be exactly determined to be the same as one of one or more clock domains of one or more clock signals for the block or module regardless of whether the clock domain information for an input signal may be ascertained during the analysis of this elaborated block. In some embodiments where a block or module is clocked by multiple clock signals, the exact output clock domain of an output signal of the block or module may be determined from these multiple clock domains during the separate elaboration and analysis of this block or module. Moreover, the presence of the proper clock synchronizer ensures that the clock domain information for the output may be safely and exactly determined. On the other hand, if the clock domain information for the input signal cannot be ascertained during the analysis of an elaborated block or module or even after propagating the clock domain information from the driving signal or block, further clock domain information propagation may be performed during integration until the clock domain information for the block is exactly determined. More details about determining exact clock domain information will be described below in the integration of clock domain information and connectivity information starting at 216 of FIG. 2B.

In another example including a feedthrough where an input signal to the feedthrough is known to be in clock domain A, the clock domain of the output signal of the feedthrough may also be exactly determined to be clock domain A. This clock domain information for the output signal is exact clock domain information because its determination involves no speculations, assumptions, or unknowns.

A determination may be made at 212 to determine whether one or more child blocks are black-boxed during the elaboration of the top hierarchy. If the determination is affirmative, these one or more black-boxed child blocks may be separately elaborated analyzed in one or more separate elaborations and analyses as is the top hierarchy from 206 to 210. In the following description, a black-boxed child block is separately elaborated and analyzed. Nonetheless, it shall be noted that more than one black-boxed child block may be grouped together into a single group so that this single group may be elaborated and analyzed as a whole.

In some embodiments where a child block, which was black-boxed during the elaboration and analysis of the top hierarchy, is separately elaborated and analyzed, the child clock domain information and connectivity information may be determined and generated at 214 in an identical or substantially similar manner as that described for the top hierarchy at 210. For example, this child block may be separately elaborated on a computing node; one or more clock analyses may be performed to drive the input signals of this child block to the directly and indirectly connected signals in the child block at the first child hierarchy under the top hierarchy. In some embodiments where the clock domain information is not yet propagated to this child block, the child clock domain information for the input signals determined at 214 is more likely speculative, and the child clock domain information for the connected signals is thus more likely speculative. In some of these embodiments where this child block is overly complex to be elaborated and analyzed by a single computing node, this child block may be further decomposed into one or more sub-blocks that may be elaborated and analyzed by a plurality of computing nodes. As in the top hierarchy, the child clock domain and connectivity information may be stored in a data structure for a child block. Some examples of such data structures for the child blocks are illustrated in FIGS. 4C-4E.

216 through 228 of FIG. 2B illustrate the integration process of various clock domain information from separate elaborations and analyses of the top hierarchy and the one or more blocks that are black-boxed during the elaboration and analysis of the top hierarchy. This integration process aggregates the connectivity, clock domain information, and topology information of various blocks in multiple hierarchies of an electronic design and thus provides a more complete picture of the structural and clock domain details for the entire electronic design, without elaborating or analyzing the electronic design in its entirety at once. This integration process further resolves any speculative information (e.g., speculative clock domain information for one or more signals at one or more pins or ports) and identify harmless CDC structures by cross referencing and propagating exact clock domain information to resolve such speculative information based on one or more rules such as those examples described with reference to 224 of FIG. 2B.

Once the clock domain and connectivity information for both the top hierarchy and the one or more black-boxed blocks is determined, the clock domain and connectivity information may be integrated or aggregated at 216 for the electronic design into an integrated data structure. In some embodiments, integration of multiple data structures for the top hierarchy and one or more child black-boxed blocks may include formatting at least one of these data structures so that the contents of all of these data structures may be stored in a single data structure such as a database table. In some embodiments, this single data structure may include speculative clock domain information that is to be subsequently resolved via, for example, propagation of exact clock domain information. Resolving speculative clock domain information will be described in greater details in subsequent paragraphs with reference to the remainder of FIGS. 2A-2B as well as FIG. 4F and FIGS. 5A-5D.

With the integrated data structure including the clock domain and connectivity information, exact clock domain information of signals may be propagated at 218 to other signals that are directly connected to the signals or indirectly connected via one or more intervening circuit components to the signals. Circuit topology may be referenced during the propagation of exact clock domain information to correlate the identifiers of the signals across hierarchies.

One or more clock domain crossing (CDC) structures may be determined at 220 based in part or in whole upon the propagated exact clock domain information. For example, a clock domain crossing structure may be identified when two signals corresponding to two different clock domains converge and are received at a circuit component, or when a signal crosses multiple clock domains. In these examples, the circuit component at which two or more signals corresponding to more than one clock domain converge, or a signal crosses multiple clock domains is determined as a clock domain crossing structure.

The exact clock domain information or the speculative clock domain information may be further classified at 222 into a plurality of classes. For example, exact or speculative clock domain information may be classified as "safe" exact clock domain information and "unsafe" exact clock domain information in some embodiments. In some embodiments, the plurality of classes of exact or speculative clock domain information may be referenced in a resolution process that compares speculative clock domain information to or with propagated exact clock domain information at a pin or port. In these embodiments, one or more CDC structures may be determined at 224 to be harmless based in part or in whole upon the classification results of the exact clock domain information as well as the clock domain information associated with one or more pins or ports. These one or more CDC structures may be ignored or discarded from further analyses to conserve computational resources such as runtime and memory footprint due to a smaller subset of CDC structures to analyze. Clock domain information of a signal may be classified as "safe" when the signal is driven by proper clock synchronization.

For example, when the speculative clock domain information matches the exact clock domain information associated with a pin of a circuit component, this circuit component may be discarded or ignored from further analyses regardless of the classification results of the exact clock domain information or the speculative clock domain information even if clock domain crossing does occur in this circuit component. That is, this circuit component may be ignored or discarded from consideration regardless of whether the exact clock domain information or the speculative clock domain information is classified as "safe" or "unsafe".

As another example, when the speculative clock domain information does not match the exact clock domain information associated with a pin or port of a circuit component, any clock domain crossing with respect to this circuit component will be reported as a CDC violation absent classification results.

As another example, when the speculative clock domain information does not match the exact clock domain information associated with a pin or port of a circuit component, any clock domain crossing with respect to this circuit component will be reported as a CDC violation due to the mismatch between the speculative clock domain information and the exact clock domain information. One scenario where CDC structures may be ignored or discarded despite a mismatch exists between the exact clock domain information and speculative clock domain information is when both the exact and the speculative clock domain information at this pin or port have been classified as "safe" yet they do not match. This may be demonstrated in the example where an output of block A (Aout) is propagated to the input of block B (Bin) that is further propagated to a first flop (F1) and a second flop (F2) that are both clocked by clock domain B ($CD_B$) without combinational logic between the first flop and the second flop. These two flops F1 and F2 effectively form a synchronizer due to the fact that both flops are clocked by clock domain B and the absence of combinational logic between F1 and F2. In this example, the input signal at block B, Bin, may be speculatively determined to be clock B, and this speculative clock domain information may be safe due to the presence of proper clock synchronization by F1 and F2. Assuming the output of block A (Aout) is driven by a flop (F3) with clock A ($CD_A$), this clock domain information for Aout may thus be exact and safe. In this example, the exact clock domain information ($CD_A$) from the output (Aout) of block A does not match the speculative clock domain information ($CD_B$) at the input of block B (Bin) although both pieces of clock domain information are deemed safe. Therefore, there will be clock domain crossing but not CDC violation in this example. That is, a CDC violation will be reported when there exists a mismatch between the exact clock domain information and the speculative clock domain information even if the exact clock domain information is classified as "safe". It shall be noted that the aforementioned examples in the preceding three paragraphs adopt an optimistic speculation mechanism although various techniques described herein may apply to the pessimistic speculation mechanism with full and equal effects.

Once the one or more harmless CDC structures have been determined, the total number of CDC structures may be reduced at least by discarding, removing, or ignoring these one or more harmless CDC structures at 226. In some embodiments, these one or more CDC structures may not be reported or may be reported but not further processed (e.g., checked or fixed). A determination may be made at 228 to determine whether convergence is reached in that all speculative clock domain information either is resolved or reconciled with the corresponding exact clock domain information or may be safely ignored from further consideration.

Figure 3A:
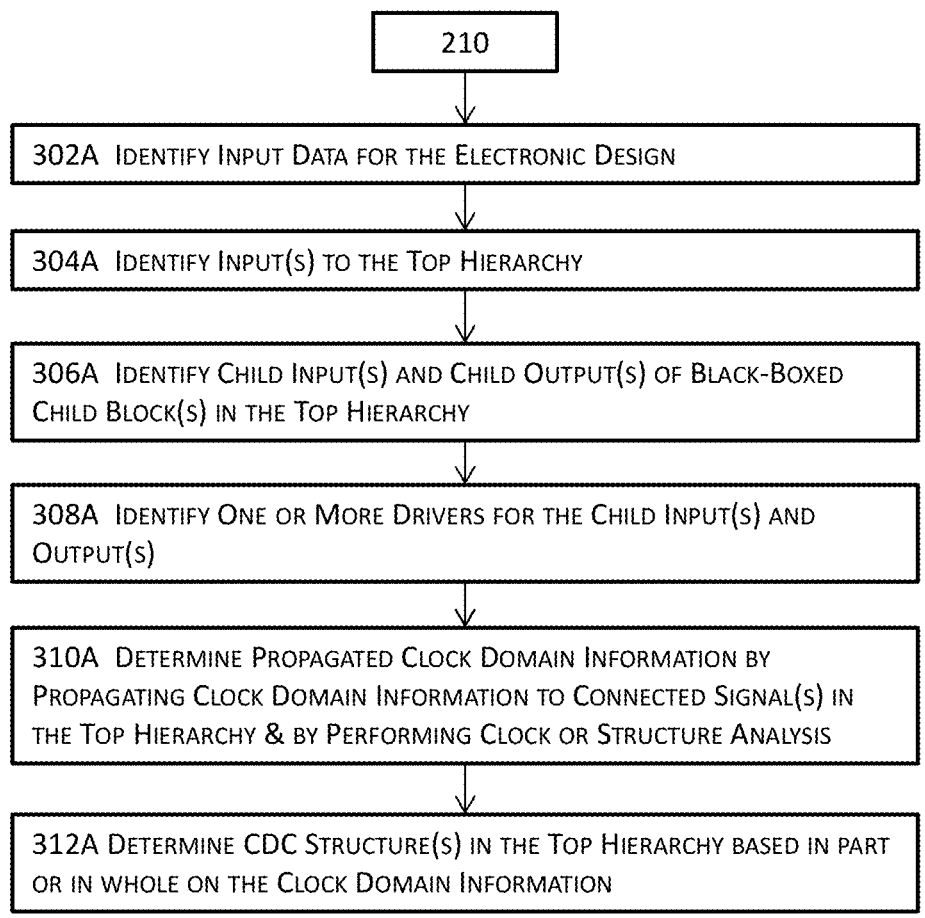
FIG. 3A illustrates a more detailed block diagram for a part of the block diagram illustrated in FIGS. 2A-2B in one or more embodiments.

FIG. 3A illustrates a more detailed block diagram for a part of the block diagram illustrated in FIGS. 2A-2B in one or more embodiments. More specifically, FIG. 3A illustrates more details about generating clock domain and connectivity information for the top hierarchy at 210 of FIG. 2A. It shall be noted that although FIG. 3A illustrates and is described with reference to the top hierarchy, the techniques illustrated and described herein may also apply to any lower hierarchy under the top hierarchy. In these embodiments illustrated in FIG. 3A, the top hierarchy is already elaborated to determine the topology and connectivity information for the top hierarchy while black-boxing one or more child blocks. These techniques identify the input signals and their respective clock domain information at the top hierarchy and drive the input signals to connected signals that are directly or indirectly connected to the input signals. The respective clock domain information of the input signals may be propagated to these connected signals by performing a clock or structural analysis. With the respective clock domain information and the propagated clock domain information, CDC structures, if any, may be identified at the top hierarchy.

More specifically, input data for the electronic design of interest may be identified at 302A. These input data will be subsequently used in various modules described herein to hierarchically elaborate the electronic design. These input data may include, for example, a set of hardware description files (e.g., a set of Hardware Description Language or HDL files), clock domain information, etc. The clock domain information such as that for the primary inputs may be provided by the designer or may be retrieved from one or more design specifications. One or more input signals to the top hierarchy may be identified at 304A. These one or more input signals may include, for example, one or more primary inputs, input signals driven by the corresponding outputs of one or more blocks, and/or one or more flops.

As described previously, it may be desired or required that one or more child blocks in the top hierarchy are to be separately elaborated due to the sizes or complexities of these one or more child blocks in some embodiments. In these embodiments, these one or more child blocks may be black-boxed during the elaboration or analysis of the top hierarchy. One or more child inputs and one or more child outputs of these one or more child blocks may be identified at 306A in the top hierarchy. Because these one or more child blocks are black-boxed during the elaboration and analysis of the top hierarchy, these one or more child inputs and outputs are located at the interface of the corresponding one or more child blocks while the contents of these one or more child blocks are left for subsequent, separate elaborations and analyses of these one or more child blocks.

In order to determine the clock domain information, the driver or driver signal (collectively driver) that drives each of the one or more child inputs may be identified at 308A by using at least the connectivity or topology information obtained from elaboration of the top hierarchy. In some embodiments, the driver for at least one child output of the one or more child outputs may also be identified at 308A. These drivers may include one or more primary input signals or one or more signals driven by at least one of these one or more child blocks in the top hierarchy.

With the input signals to the top hierarchy, the child inputs and outputs, as well as the drivers for the child inputs and outputs identified, propagated clock domain information may be determined by propagating the clock domain information in the input data at 310A to all the connected signals by using, for example, the topology or connectivity information or a structure or clock analysis. A clock or structure analysis may also be performed to determine the propagated clock domain information for some of the connected signals in some embodiments. For example, the clock or structure analysis may provide that the clock domain of the output of a feedthrough may be determined to be the clock domain of the input of the feedthrough.

In this example illustrated in FIG. 3A, the propagated clock domain information may include exact as well as speculative clock domain information even though the clock domain information in the input data may be exact clock domain information. This is because the corresponding data for the black-boxed blocks are either unavailable (e.g., elaboration and analyses performed on a separate computing node) or missing (e.g., elaboration and analyses are not yet performed), and thus some of the clock domain information is not yet ascertainable.

One or more CDC structures in the top hierarchy may be determined at 312A when the clock domain information in the input data as well as the propagated clock domain information of the connected signals indicate clock domain crossing in these one or more CDC structures. In some embodiments, at least one of the CDC structure in the one or more CDC structures may be tentative and subject to subsequent confirmation during the integration process. The integration process thereafter integrates various pieces of clock domain information from separate elaborations and analyses of the top hierarchy and the one or more black-boxed blocks as described in 216 through 228 of FIG. 2B.

Figure 4A:
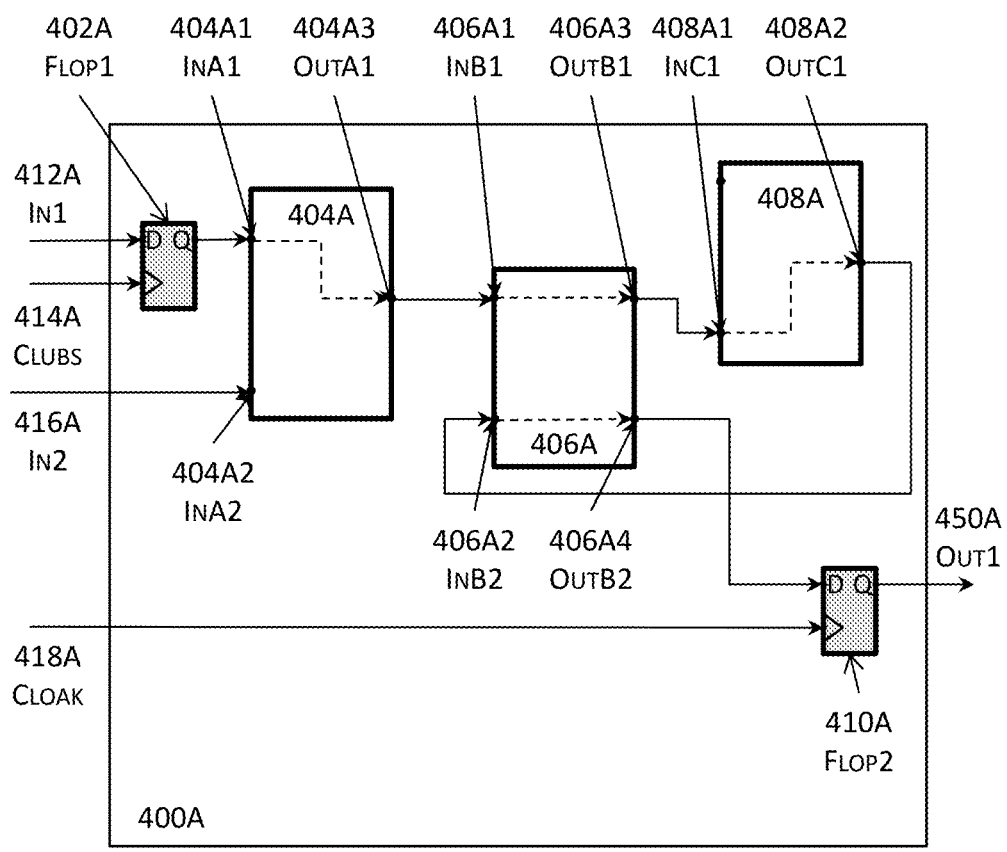
Figure 4C:
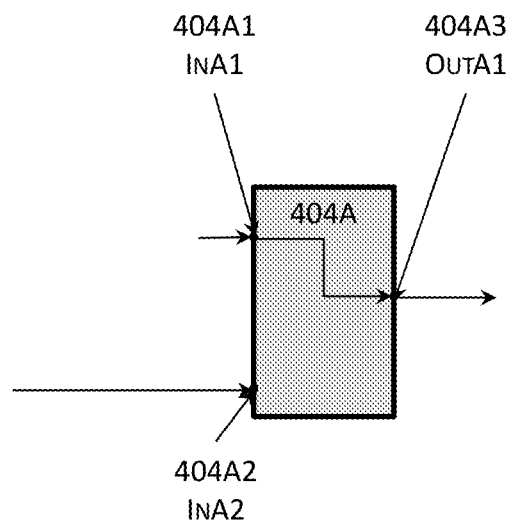
Figure 4D:
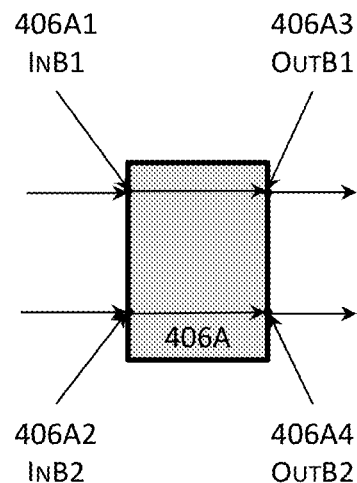
Figure 4E:
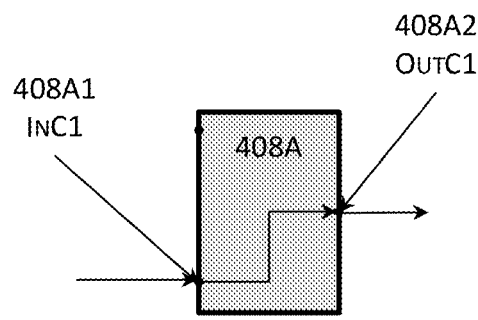

Working examples of the operations of the process are illustrated in FIGS. 4A-4B, the electronic design includes the top hierarchy 400A that further includes the first flop 402A (Flop1) and the second flop 410A (Flop2). Connectivity information of signals in the top hierarchy 400A may be determined during the elaboration of the top hierarchy. The top hierarchy elaboration expands the HDL description to represent the top hierarchy and the instances (e.g., Verilog instances) or modules (e.g., VHDL entities) into unique objects, evaluates, and propagates ports, constants, and parameters (e.g., Verilog parameters) or generics (e.g., VHDL generics) throughout the description of the top hierarchy.

With the input signals (e.g., 412A and 416A) and clock signals (e.g., 414A and 418A) to the top hierarchy identified, the elaboration process may propagate these input signals to directly or indirectly connected signals. The clock domain information provided for these input signals may also be propagated during the propagation of the input signals to exactly or speculatively determine the propagated clock domain information of these directly or indirectly connected signals while referencing the clock domain information of the clock signals.

For example, the elaboration of the top hierarchy at a computing node may provide that the first flop 402A receives input signal 412A (In1) and is clocked by clock signal 414A (ClkB). The output of Flop1 402A drives the input 404A1 (InA1) of block A (404A) which also receives another input signal 416A (In2) that drives the input 404A2 (InA2). The output 404A3 (OutA1) is connected to and drives the input 406A1 (InB1) of block B (406A). This input 406A1 is propagated to the output 406A3 (OutB1) which further drives the input 408A1 (InC1) of block C (408A). The input 408A1 of block C (408A) is propagated to the output 408A2 (OutC1) which in turn drives another input 406A2 (InB2) of block B (408A). This input 408A2 of block B is propagated within block B to the output 406A4 (OutB2) which is further propagated to the input of Flop2 (410A). Flop2 is clocked by the clock signal 418A (ClkA) to generate the output 450A (Out1).

By propagating the input signals (e.g., 412A and 416A) and clock signals (e.g., 414A and 418A) while referencing the clock domain information of these input and clock signals, propagated clock domain information may be exactly or speculatively determined for the signals connected to the input signals as illustrated in Table 1 of FIG. 4B. The data structure illustrated in FIG. 4B includes the signals in the top hierarchy. For each signal in the top hierarchy, this data structure further includes the corresponding drivers, clock domain information, and the sources from which the clock domain information is obtained. For example, Table 1 in FIG. 4B shows that the input signal 412A and clock signal 418A belong to clock domain A, and input signal 416A and clock signal 414A belong to clock domain B. This clock domain information for these two input signals and clock signals are exact clock domain information because these pieces of information are provided by, for example, a designer or a design specification. The input signal (412A) in clock domain A and the clock signal 414A in clock domain B thus converge at Flop1 (402A) which may thus be identified as a CDC structure due to the convergence of two signals in two different clock domains at Flop1.

By driving the input signal through Flop1, the clock domain of the input signal 404A1 for block A (404A) may be determined to be domain B because Flop1 (402A) is clocked by the clock signal 414A in clock domain B. The other input signal 404A2 of Block A (404A) is directly driven by input signal 416A without intervening circuit components, and the clock domain for this input signal 404A2 may thus be determined to be the same as the input signal 416A—clock domain B.

For Block B (406A), the top hierarchy elaboration and analysis may only provide that the clock domain for the input 406A1 (InB1) is the same as that of the output 404A3 (OutA1) of Block A (404A), and that the clock domain for the other input 406A2 (InB2) is the same as that of the output OutC1 (408A2) of Block C (408A). For Block C (408A), the top hierarchy elaboration and analysis may only provide that the clock domain for the input 408A1 (InC1) is the same as that of the output 406A3 (OutB1) of Block B (406A). For Flop2 (410A), the driver of the input may be identified as the output signal OutB2 (406A4), and its clock domain may be determined by a clock analysis to be clock domain A from the clock signal 418A. The results of elaborating and analyzing the top hierarchy are illustrated in Table 1 of FIG. 4B.

It shall be noted that some speculative clock domain information in Table 1 needs to be resolved with additional information from the separate elaboration and analysis of blocks 404A, 406A, or 408A. The resolution of speculative clock domain information is described above in 216-228 of FIG. 2B and will be further described with reference to the example illustrated in Table 5 of FIG. 4F below.

Figure 3B:
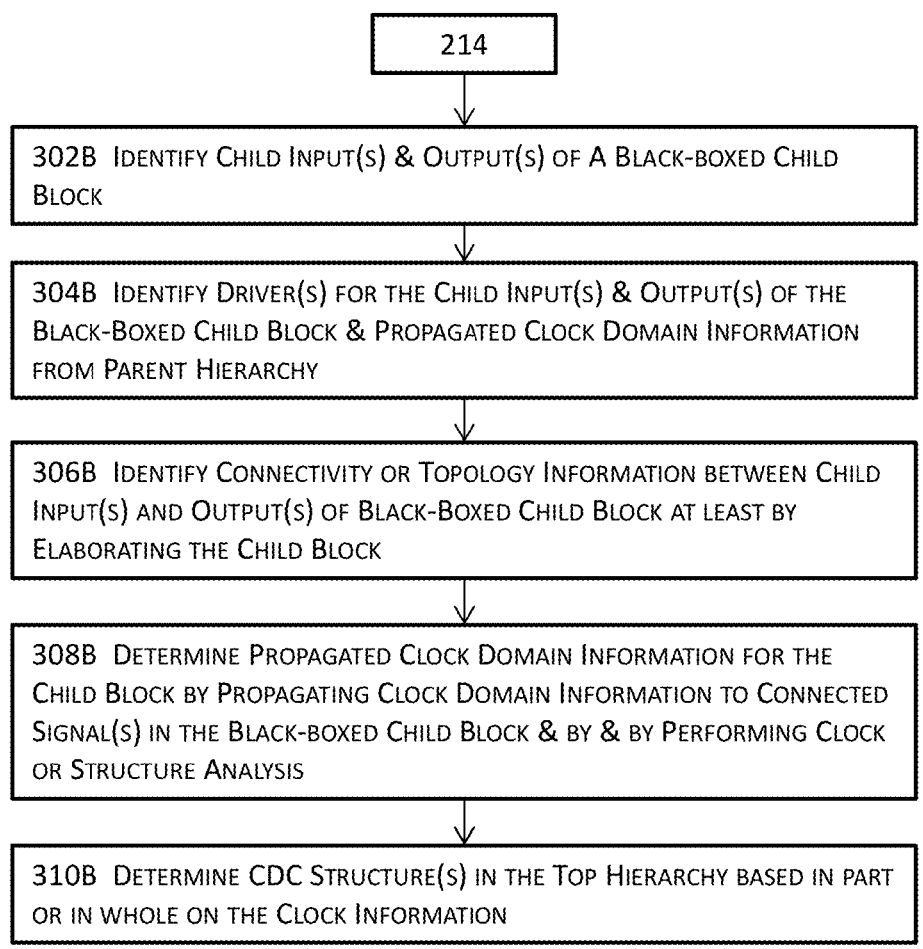
FIG. 3B illustrates a more detailed block diagram for another part of the block diagram illustrated in FIGS. 2A-2B in one or more embodiments.

FIG. 3B illustrates a more detailed block diagram for another part of the block diagram illustrated in FIGS. 2A-2B in one or more embodiments. More specifically, FIG. 3B illustrates more details about the techniques of generating child hierarchy clock domain and connectivity information (214) of FIG. 2A. The process illustrated in FIG. 3B resembles that illustrated in FIG. 3A for the top hierarchy. In these embodiments, one or more child inputs and child outputs of a black-boxed child block at a child hierarchy may be identified at 302B. The identifiers of the corresponding pins or ports for these one or more child inputs and outputs may also be identified. These identifiers may be cross referenced or linked to the corresponding information in the topology or connectivity information of the parent hierarchy of the child hierarchy to ensure that correct pins or ports may be identified during propagation of signals or clock domain information in the integration process.

One or more drivers that drive the one or more inputs and outputs may be identified at 304B. A driver for an input of the child block may include a primary input or, optionally, an output signal of another block at a higher hierarchy. A driver for an output of the child block may include an input signal or a clock signal to the child block. These one or more drivers may be subsequently referenced to determine propagated clock domain information during propagation of the one or more input signals within the child block. In addition to identifying one or more drivers, the propagated clock domain information for the parent hierarchy may also be identified at 304B.

Connectivity or topology information for the child block may be identified at 306B at least by elaborating the child block at a computing node that expands the description (e.g., HDL description) to represent the child block in unique objects. In some embodiments, the child block may include one or more instances or modules whose sizes or complexities desire or require a separate elaboration or analysis. In these embodiments, these one or more instances or modules may be black-boxed during the elaboration or analysis of the child block and may be further sent to one or more computing nodes for one or more separate elaborations or analyses so that the computing node elaborating or analyzing the child block will not require substantially longer runtime to complete for proper load balancing in a parallel or distributed computing paradigm. The propagated clock domain information for the one or more child inputs may be propagated at 308B to signals that are directly or indirectly connected to these one or more child inputs.

With the connectivity or topology information determined, propagated clock domain information in the child block may be determined at 308B at least by propagating the clock domain information to signals directly or indirectly connected to the one or more child input signals. The clock domain information being propagated includes the propagated clock domain information determined for the parent hierarchy of the child block. For example, if the child block is situated at the child hierarchy right below the top hierarchy without any other intervening hierarchies, the clock domain information being propagated at 308B includes the propagated clock domain information determined at 310A of FIG. 3A for the top hierarchy. In some embodiments, only exact propagated clock domain information from the parent hierarchy is propagated at 308B. In some other embodiments, both exact and speculative propagated clock domain information is propagated at 308B.

One or more CDC structures in the child block may be determined at 310B when the propagated clock domain information from the parent hierarchy as well as the propagated clock domain information of the connected signals in the child block indicate clock domain crossing in these one or more CDC structures. Similar to the CDC structures identified at 312A of FIG. 3A for the top hierarchy, one or more of these CDC structures may be tentatively determined and may be subject to subsequent confirmation during the integration proves that integrates various clock domain information from separate elaborations and analyses of the top hierarchy and the one or more black-boxed blocks.

FIG. 4C illustrates an example of the techniques illustrated in FIG. 3B and applied to Block A (404A) that is situated below the top hierarchy 400A of FIG. 4A. In this example, block A (404A) may be elaborated at a computing node to determine the connectivity or topology information of Block A. These techniques described in FIG. 3B identify the input signals (404A1 and 404A2) and the output signal (404A3). As illustrated in FIG. 4C, the connectivity or topology information from elaboration of Block A reveals that the output 404A3 (OutA1) is driven by the input 404A1 (InA1) but not by the other input 404A2 (InA2). Therefore, 404A1 may be identified as the driver for the output signal 404A3 (OutA1). This piece of connectivity or topology information between 404A1 and 404A3 is illustrated as a solid arrowhead connecting 404A1 and 404A3 (compared to the dashed line between 404A1 and 404A3 in FIG. 4A that indicates the unavailability of such information).

In Table 1, the drivers for both input signals are not identified in this example. This may be due to the concurrent elaboration or processing of both the top hierarchy (400A) and Block A (404A) and thus the unavailability of the driver information for input signals of Block A. If the propagated clock domain information from the top hierarchy is available, the clock domain for input signals 404A1 and 404A2 (as well as the driver for both input signals) may be identified as clock domain B from the propagated clock domain information. Otherwise, the clock domain for the output signal 404A3 (OutA1) may be determined to be "same as 404A1" by driving the input signal 404A1 with the connectivity or topology information from the elaborated block A (404A). In some embodiments, the clock domain information for the input signal 404A2 and the output signal 404A3 may be determined by driving the primary input 416A.

FIG. 4D illustrates another example of the techniques illustrated in FIG. 3B and applied to Block B (406A) that is situated below the top hierarchy 400A of FIG. 4A. In this example, block B (406A) may be separately elaborated at a computing node to determine the connectivity or topology information of Block B. These techniques described in FIG. 3B identify the input signals 406A1 (InB1) and 406A2 (InB2) as well as the output signals 406A3 (OutB1) and 406A4 (OutB2). As illustrated in FIG. 4D, the connectivity or topology information from elaboration of Block B reveals that the first input signal 406A1 drives the first output signal 406A3, and that the second input signal 406A1 drives the second output signal 406A4. The drivers for both output signals may thus be determined and populated into the data structure as shown in Table 3 of FIG. 4D.

Absent connectivity or topology information from the parent hierarchy (top hierarchy for Block B), the driver information for the input signals 406A1 and 406A2 cannot be determined yet and is thus left blank. Similarly, the clock domain information for the input signals 406A1 and 406A2 may also be speculatively determined to be "InB1" (or 406A1) and "InB2" (or 406A2) respectively for input signals 406A1 and 406A2 due to the absence of propagated clock domain information from the top hierarchy. This missing driver and clock domain information may be added during the subsequent integration process. The clock domain information for the output signals 406A3 and 406A4 may also be determined to be "same as 406A1" and "406A2", respectively. This clock domain information for the output signals is nevertheless speculative because the clock domain information for the input signals cannot be definitively determined yet.

FIG. 4E illustrates another example of the techniques illustrated in FIG. 3B and applied to Block C (408A) that is situated below the top hierarchy 400A of FIG. 4A. In this example, block C (408A) may be separately elaborated at a computing node to determine the connectivity or topology information of Block C. These techniques described in FIG. 3B identify the input signal 408A1 (InC1) and the output signal 408A2 (OutC1). As illustrated in FIG. 4E, the connectivity or topology information from elaboration of Block C reveals that the output 408A2 (OutC1) is driven by the input signal 408A1 (InC1). Moreover, when the top hierarchy results are unavailable during the elaboration and analysis of Block C, the data structure shown in Table 4 of FIG. 4E shows that the input signal 408A1 drives and hence is the driver for the output signal 408A2. Because of the unavailability of the top hierarchy results, the driver information for the input signal 408A1 is missing from Table 4.

Furthermore, the clock domain for the input signal is "408A1" with the information source "speculation" due to the unavailability of the top hierarchy results. By driving the input signal based on the connectivity or topology information determined from the elaboration of Block C 408A, the clock domain of the output signal 408A2 may be determined to be "same as 408A1" (same as the driver). The clock domain information for both the input and output signals is speculative because the clock domain of the output signal is the same as that of the input signal, yet the clock domain for the input signal 408A1 cannot be definitively determined without additional information propagated from the parent hierarchy (top hierarchy).

FIG. 4F illustrates an example of an integrated data structure generated by an integration process using the data structures in FIGS. 4B-E. The integration process propagates clock domain information by cross-referencing connectivity or topology information from different blocks and resolves any information that may be speculatively determined. The integration process may also add any information that is missing in those data structures separately generated during the elaborations and analyses of individual blocks.

For example, the drivers for the input signals 404A1 and 404A2 in Table 2 of FIG. 4C are missing due to insufficient information during the elaboration of Block 404A. These two drivers may be respectively determined to be 402A Output and 416A from the connectivity or topology information for the top hierarchy. The clock domain information for 404A1 and 404A2 may also be exactly determined to be domain B, also from the propagated clock domain information for the top hierarchy.

Similarly, the drivers for the input signals 406A1 and 406A2 in Table 3 of FIG. 4D are missing due to insufficient information during the elaboration of Block 406A. These two drivers may be respectively determined to be 404A1 and 408A2 from the connectivity or topology information for the top hierarchy. The clock domain information for 406A1 may also be exactly determined to be the same as 404A3 which is in clock domain B as its driver (input signal 404A1), also from the propagated clock domain information for the top hierarchy. The clock domain information for 406A2 may be determined by the clock or structure analysis while cross referencing the relevant circuit components in the top hierarchy and Block C 408A.

More specifically, the clock domain for the input signal 408A1 and the output signal 408A2 of Block C 408A is the same as that of the output signal 406A3 (the driver for 408A1). Because the clock domain for 406A3 is already determined to be clock domain B, both the input signal 408A1 and the output signal 408A2 belong to clock domain B. As a result, the input signal 406A2 of Block B 406A driven by the output signal 408A2 of Block C (408A) also belongs to clock domain B as illustrated in Table 5 of FIG. 5F. For Flop2 410A, the input signal is driven by the output signal 406A4 of Block B (406A) and thus belongs to clock domain B. Because Flop2 410A is clocked by clock signal 418A in clock domain A, these two signals with asynchronous clock domains converge at Flop2, and Flop2 may thus be identified as a CDC structure, as Flop1 is.

Figure 4G:
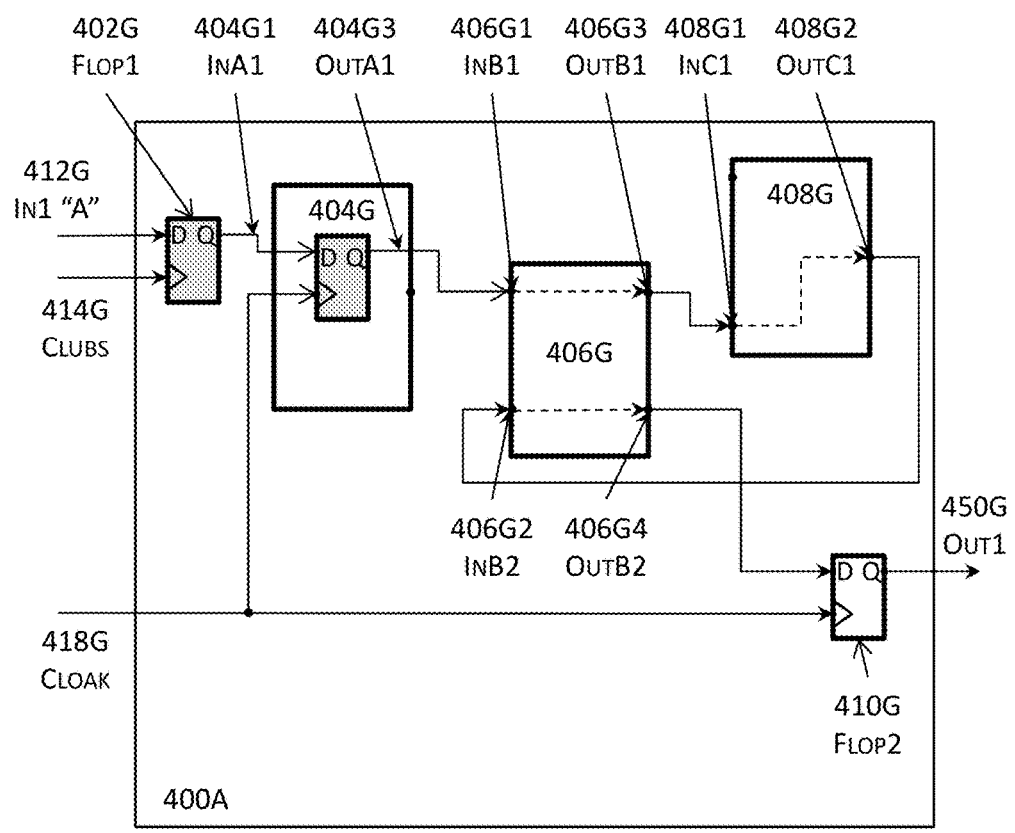
FIG. 4G illustrates another example of the application of various techniques described herein to an example electronic design in some embodiments.

FIG. 4G illustrates another example of the application of various techniques described herein to an example electronic design in some embodiments. The top-level hierarchy may be first elaborated and analyzed to obtain the connectivity (e.g., various port identifications, interconnections between blocks, etc.) and clock domain information while the blocks (e.g., Flop1 402G, Block A 404G, Block B 406G, Block C 408G, and Flop 2 410G) are black-boxed and hence not elaborated or analyzed at this stage. During a separate block elaboration and analysis for Flop1 402G, the input signal 412G is in clock domain A, and the clock signal 414G is in clock domain B as provided. The output clock domain information for the output signal and hence the input signal to Block A 404G1 may thus be exactly determined to be clock domain B. Flop 1 (402G) may thus be identified as a CDC component because the input signal 412G in clock domain A and the clock signal 414G in clock domain B converge at Flop 1 (402G). In this example, Flop 1 (402G) is fully determined so no further analysis is needed to determine clock domain information for Flop 1 (402G).

During the separate block elaboration and analysis for Block A 404G, the input signal 404G1 may be optimistically speculated to be in the same domain of the clock domain of the clock signal so as not to introduce CDC violations from speculation in some embodiments. In some other embodiments, the input signal 404G1 may be pessimistically speculated to be in a different clock domain (e.g., a new clock domain C) from the clock signal to force a CDC violation that will be subsequently confirmed or verified during propagation of clock domain information. When the connectivity information is available, the clock domain of the input signal InA1 (404G1) may be determined to be in the same clock domain as the output signal of Flop 1 (402G) according to the driving register rule—a signal driven by a driving register is in the same clock domain as the output signal of the driving register. The clock signal of the flop in Block A 404G may be exactly determined to be in clock domain A that is provided by, for example, a designer or specified in a design specification. The output signal OutA1 (404G3) may also be exactly determined to be in the same clock domain—clock domain A—of the clock signal.

During the separate block elaboration and analysis for Block B 406G, the first input InB1 (406G1) may be determined to be in the clock domain of outA1 (404G3) of Block A. This clock domain information of OutA1 is not available until propagation of clock domain information during the subsequent integration process. Similarly, the second input InB2 (406G2) may be determined to be in the clock domain of OutC1 (408G2) of Block C. This clock domain information of OutA1 is also unavailable until propagation of clock domain information during the subsequent integration process. The first output signal OutB1 (406G3) may be exactly determined at this stage to belong to the same clock domain of the first input signal InB1 (406G1) due to the structural characteristic revealed during the elaboration and analysis of Block B (406G). The second output signal OutB2 (406G4) may also be exactly determined at this stage to belong to the same clock domain of the second input signal InB2 (406G2) also due to the structural characteristic revealed during the elaboration and analysis of Block B (406G).

During the separate block elaboration and analysis for Block C 408G, the input signal InC1 (408G1) may be exactly determined to belong to the same clock domain of the first output OutB1 (406G3) of Block B (406G). The output signal OutC1 (408G2) may also be exactly determined to belong to the same clock domain of the input signal InC1 (408G1) of Block C (408G). These two pieces of exact clock domain information may be subsequently determined during propagation of clock domain information in the integration stage.

During the separate block elaboration and analysis for Flop 2 410G, the input clock domain may be determined to be in the same clock domain of the second output signal OutB2 (406G4) of Block B (406G) from the driver rule—a driven signal is in the same clock domain as its driver signal. The clock signal may be exactly determined to be in clock domain A that is provided by, for example, a designer or specified in a design specification. The output signal Out1 (450G) may be exactly determined to be in the same clock domain—clock domain A—of the clock signal for Flop 2 (410G).

During propagation of clock domain information, the clock domain information (clock domain B) for the output Q pin of Flop 1 (402G) may be propagated to finally determine that the input signal InA1 (404G1) to the D-pin of the flop in Block A (404G) is in clock domain B. In some embodiments including pessimistic speculation of clock domain C for the input signal InA1 (404G1), the propagation of clock domain information may result in the conclusion that clock domain C does not exist in the global context and is actually a subset of clock domain B. The flop or the entire Block B (404G) may thus be identified as another CDC structure because the input signal 404G1 in clock domain B and the clock signal 418G in clock domain A converge at the flop in Block A (404G).

In addition, the clock domain information (clock domain A) of the output signal OutA1 (404G3) may be propagated to finally determine that the first input signal InB1 (406G1) and hence the first output signal OutB1 (406G3) are both in clock domain A. This clock domain information of the first output signal may be further propagated to Block C (408G) to finally determine that the input signal InC1 (408G1) and hence the output signal OutC1 (408G2) are both in clock domain A. The clock domain (clock domain A) of Block C (408G) may be further propagated to Block B (406G) to finally determine that the second input signal InB2 (406G2) and hence the second output signal OutB2 (406G4) are both in clock domain A.

For Flop 2 (410G), the clock domain information of the second output signal OutB2 (406G4) may be propagated to finally determine that the input signal at the D-pin of Flop 2 (410G) is in clock domain A. Because both the input signal at the D-pin and the clock signal at the clock pin belong to clock domain A, Flop 2 does not exhibit any CDC violations and is thus not identified as such.

Figure 5A:
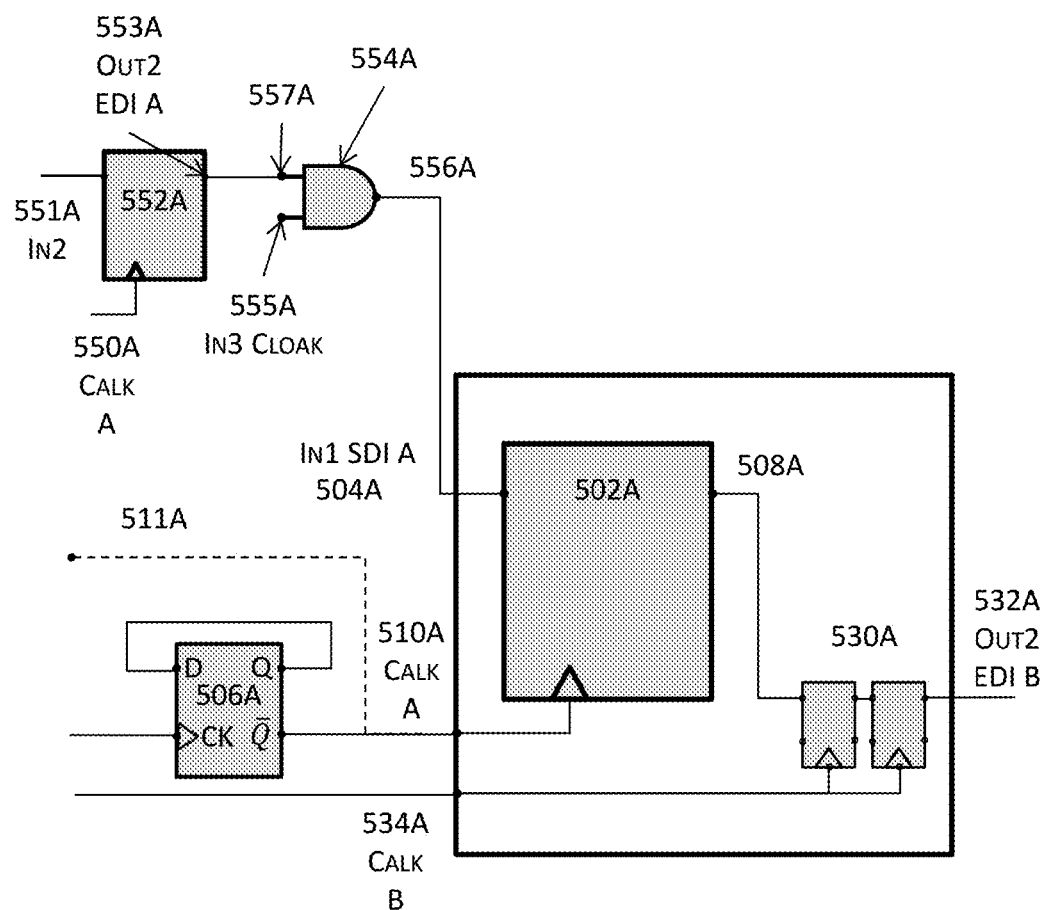
FIGS. 5A-D illustrate some examples of determining clock information for an example of an electronic design to which various techniques for verifying an electronic design using hierarchical clock domain crossing verification techniques are applied in one or more embodiments.

FIGS. 5A-D illustrate some examples of determining clock information for an example of an electronic design to which various techniques for verifying an electronic design using hierarchical clock domain crossing verification techniques are applied in one or more embodiments. FIG. 5A illustrates an example where the speculative clock domain information matches the exact clock domain information for a signal or port. When the speculative clock domain information matches the exact clock domain information, the circuit component may be considered harmless and may thus be ignored or discarded from further consideration when an optimistic speculation approach is employed. More specifically, flop 552A clocked by clock signal 550A receives an input 551A and generates an output 553A that further drives a first input 557A of an AND gate 554A. AND gate 554A receives a second input 555A, performs the Boolean AND operation, and generates the output 556A. The output 556A of the AND gate drives an input 504A of flop 502A. Flop 502A is clocked by a clock signal 511A or a frequency divider 506A that generates the clock signal 510A in clock domain A. Flop 502A generates an output 508A that is propagated to clock synchronizer 530A which is clocked by clock signal 534A in clock domain B and in turn generates the output 532A also in clock domain B as the clock signal 534A.

In this example, the clock domain information for 504A may be speculatively determined to be clock domain A because flop 502A is clocked by clock signal 510A in clock domain A during the elaboration and analysis of flop 502A. During integration, the clock domain information for output signal 553A may be exactly determined to be clock domain A if the input signal 551A also belongs to clock domain A although it is unknown whether the input signal 551A has gone through a CDC structure. That is, although the clock domain information for 553A and hence 557A and 556A may be exactly determined, this exact clock domain information may nevertheless be classified as "safe" or "unsafe" because whether the input signal 551A has gone through a CDC structure without proper synchronization is unknown. For the AND gate 554A, the output signal 556A may also be exactly determined to be clock domain A because the other input signal 555A also belongs to clock domain A as provided by the designer and also because the other input 557A is also exactly determined to belong to clock domain A. The input 504A for flop 502A may thus be exactly determined to belong to clock domain A, although this exact clock domain information may be classified as "safe" or "unsafe".

Therefore, the clock domain information for signal 504A from the elaborated flop 502A is speculatively determined to be clock domain A. The clock domain information from the integration process indicates that the clock domain information for signal 504A is exactly determined to be clock domain A, although this exactly determined clock domain information may be classified as "safe" or "unsafe", depending on whether the input signal 551A in a clock domain different from clock domain A has proceeded through a CDC structure without proper synchronization. Nonetheless, because the speculative clock domain information matches that of the speculative clock domain information for signal 504A, this signal 504A may be deemed fine and ignored from further consideration or analysis, regardless of the classification result of the exact clock domain information.

Figure 5B:
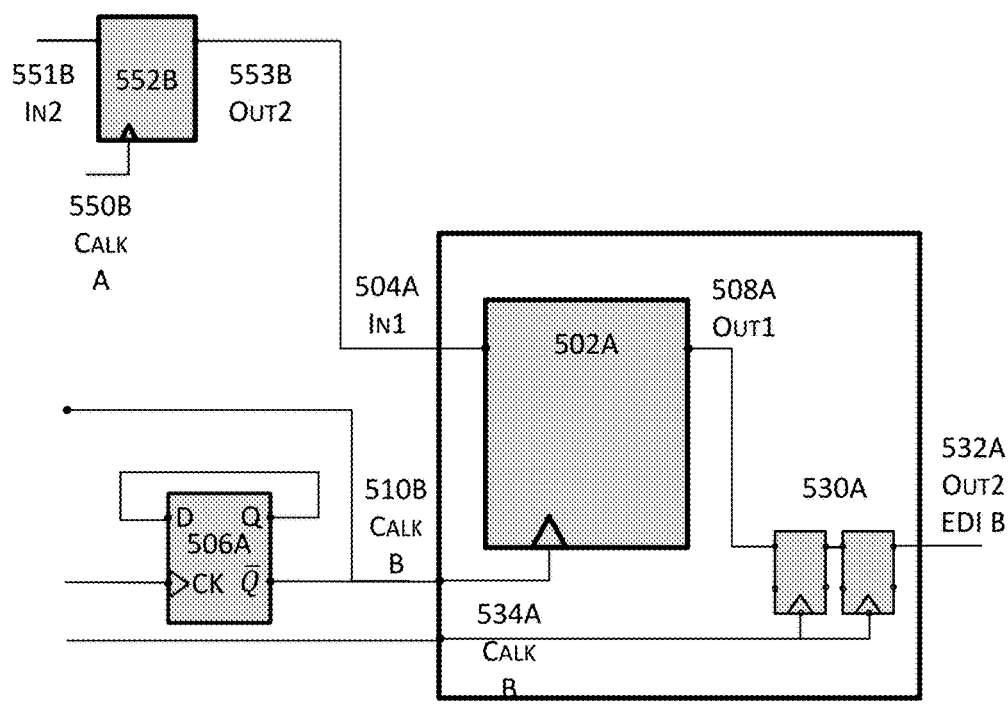

FIG. 5B illustrates another example where a potential CDC structure is reported. In this example, block 552B clocked by clock signal 550B in clock domain A receives input 551B and generates output signal 553B that in turn drives the input signal 504A of flop 502A. Similar to FIG. 5A, flop 502A is clocked by a clock or frequency divider 506A that generates the clock signal 510B in clock domain B. Flop 502A generates an output 508A that is propagated to clock synchronizer 530A which is clocked by clock signal 534A in clock domain B and in turn generates the output 532A also in clock domain B as the clock signal 534A. It shall be noted that although each block in the drawing figures appears to be clocked by a single clock signal, a block described in various embodiments may nevertheless be clocked by a plurality of clock signals in two or more clock domains. Therefore, during the elaboration or analysis at a higher hierarchical level where such a block is black-boxed, an output signal of such a block may be speculated to be in one of these two or more clock domains.

During the elaboration and analysis of flop 502A, the input signal may be speculatively determined to belong to clock domain B because flop 502A is clocked by clock signal 534A in clock domain B. During the integration, the output signal 553B may be exactly determined to belong to clock domain A because block 552B is clocked by clock signal 550B in clock domain A. Similar to the example illustrated in FIG. 5A, this exact clock domain information for the output signal 553B may be classified as "safe" or "unsafe", depending upon whether the input signal 551B has proceeded through a CDC structure. In other words, the classification of the exact clock domain information of the output signal 553B (and hence that for connected signals) cannot be ascertained yet.

Because the output signal 553B of block 552B drives the input signal 504A of flop 502A, the input signal 504A may be exactly determined to belong to clock domain A due to the absence of intervening circuit components between the output of block 552B and the input of flop 502A. In resolving the speculative clock domain information of signal 504A from the elaboration and analysis of flop 502A, the speculative clock domain information (speculatively clock domain B) may be compared to the exact clock domain information (exactly clock domain A) from the integration process. This comparison yields a mismatch between these two pieces of clock domain information. As described above, the mismatch indicates a potential CDC structure that may be ignored or discarded from further analyses or consideration when both the speculative and exact clock domain information may be classified as "safe". Therefore, flop 502A may be reported as a CDC structure in this example.

Figure 5C:
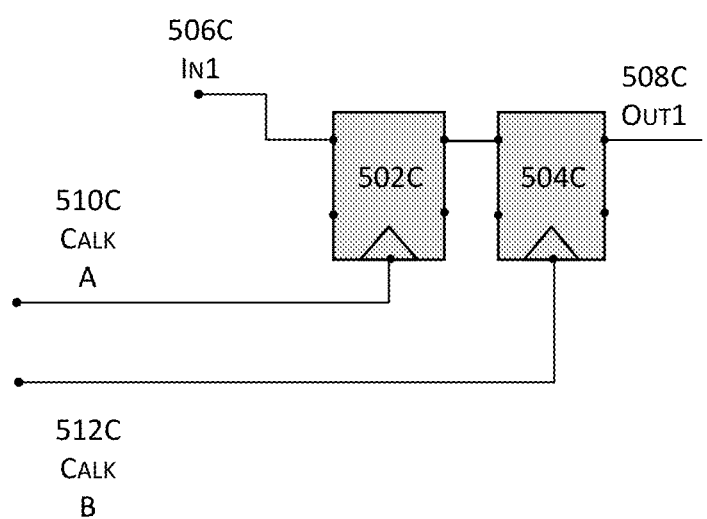
Figure 5D:
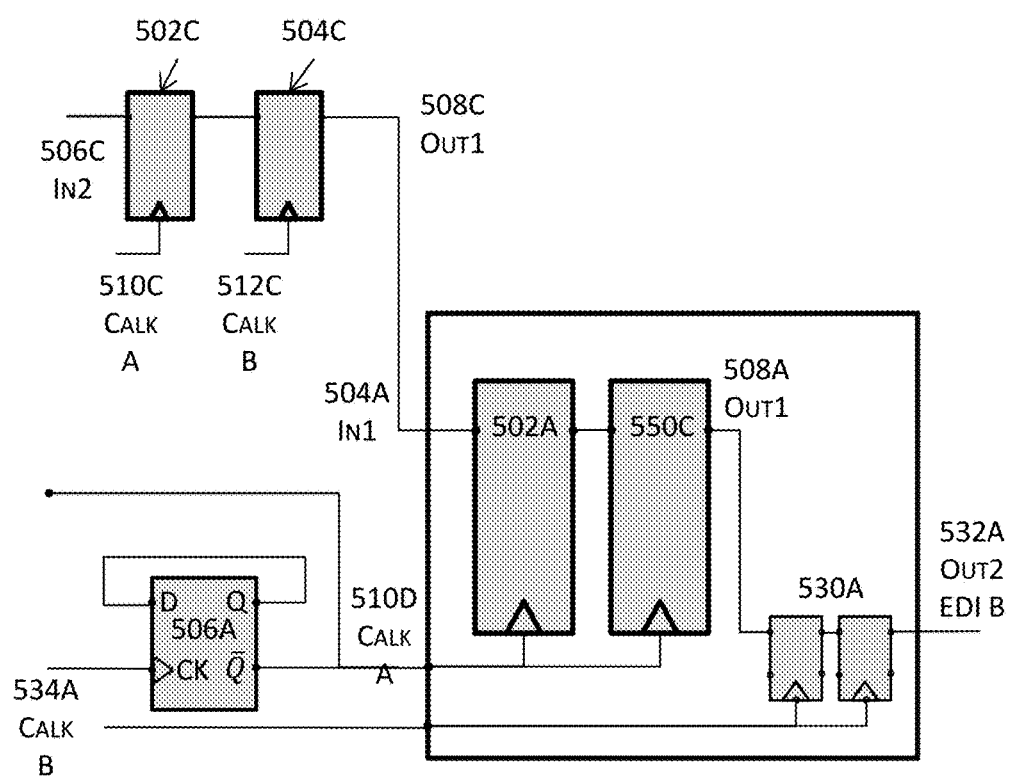

FIG. 5C illustrates clock domain crossing that may not be definitively classified as "safe" or "unsafe". More specifically, the output signal 508C of block 504C may be exactly determined to belong to clock domain B because block 504C is clocked by clock signal 512C in clock domain B. Nonetheless, block 502C receiving the input signal 506C is clocked by clock signal 510C in clock domain A so its output signal may also be exactly determined to belong to clock domain A because without elaborating and analyzing block 504C, this clock domain crossing between blocks 502C and 504C may be harmless or harmful (e.g., a CDC violation). For example, block 504C may include proper clock synchronization that properly synchronizes the asynchronous clock signals. In this example, the clock domain crossing may be rendered harmless. Whether this clock domain crossing between blocks 502C and 504C may not be ascertained without elaborating at least block 504C. FIG. 5D illustrates, however, an example to determine whether this clock domain crossing may be a CDC violation or harmless without elaborating block 504C.

FIG. 5D illustrates another example where clock domain crossing may be mitigated. More specifically, the input signal 504A is driven by the output signal 508C of block 504C. Therefore, the input signal 504A may also be exactly determined to belong to clock domain B. Similar to the output signal 508C of block 504C, the exact clock domain information for the input signal 504A may not be definitively determined to belong to clock domain B due to the same reasons as described above for FIG. 5C.

During the elaboration and analysis of flop 502A, the input signal 504A may be speculatively determined to belong to clock domain A because flop 502A is clocked by clock signal 510D in clock domain A. The mismatch between the speculative clock domain information (clock domain A) for 504A from the elaborated flop 502A and the exact clock domain information (clock domain B) from the integration may indicate a CDC violation. As described above, if both the exact clock domain information and the speculative clock domain information are both classified as "safe", this CDC violation and hence the CDC structure may be ignored from further consideration, analyses, or fixes.

In this example, this rule may not apply because of the uncertainty described above. Although the exact clock domain information (domain B) for the input signal 504A may not be definitively determined to belong to clock domain B, with the addition of the clock synchronization, 502A and 550C may nevertheless properly synchronize the signals even if the signals actually come from asynchronous clock domains. Therefore, the structural analysis discovering this proper clock synchronization may determine that this CDC violation is actually harmless due to the presence of proper clock synchronization and thus exclude this CDC structure from further consideration, analyses, or fixes to conserve computational resources.

FIG. 1A illustrates a high level schematic block diagrams for verifying an electronic design using hierarchical clock domain crossing verification techniques in one or more embodiments. More specifically, FIG. 1A illustrates an illustrative high level schematic block diagrams for verifying an electronic design and may comprise one or more computing systems or computing nodes 100, such as one or more micro-processors, one or more processor cores, one or more general purpose computer, or any combinations thereof (collectively "a computing node" for singular or "computing nodes" for plural) as described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc. The verification engine 170 may perform formal verification tasks in some embodiments.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of modules 152 including hardware modules and software modules or combinations of one or more hardware modules and one or more software modules. Each of these modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A module is initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

The set of modules 152 may comprise a hierarchical partition module 102 to partition an electronic design or a portion thereof into a plurality of blocks. The set of modules 152 may also include a propagation module 104 to propagate signals in an electronic design or a portion thereof or to propagate clock domain information of a signal to one or more other signals that are directly connected to the signal or indirectly via one or more intervening circuit components to the signal.

The set of modules 152 may further optionally include a CDC analysis module 106 to perform one or more clock and/or structure analyses to identify CDC violations. In addition or in the alternative, the set of modules 152 may include an integration module 108 to integrate separate elaboration and analysis of individual blocks and to resolve any missing, speculative, or tentative information in these separate elaboration and analysis of individual blocks.

The set of modules 152 may include a clock analysis module 110 that functions in tandem with, for example, the propagation module 104, the CDC analysis module 106, the integration module 108, and/or the elaboration module 112 to perform one or more clock analyses to determine clock domain information. The set of modules 152 may include an elaboration module 110 that elaborates an electronic design or a portion thereof by expanding the HDL description to represent the electronic design or the portion thereof as well as the instances (e.g., Verilog instances) or modules (e.g., VHDL entities) into unique objects and by evaluating and propagating ports, constants, and parameters (e.g., Verilog parameters) or generics (e.g., VHDL generics) throughout the representation of the electronic design or the portion thereof.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The set of modules 152 may further optionally include one or more signoff modules (not shown) to perform various signoff and design closure tasks. For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level or better accuracy to ensure an electronic design meets or exceeds power, performance, and/or area goals in some embodiments.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

System Architecture Overview

Figure 6:
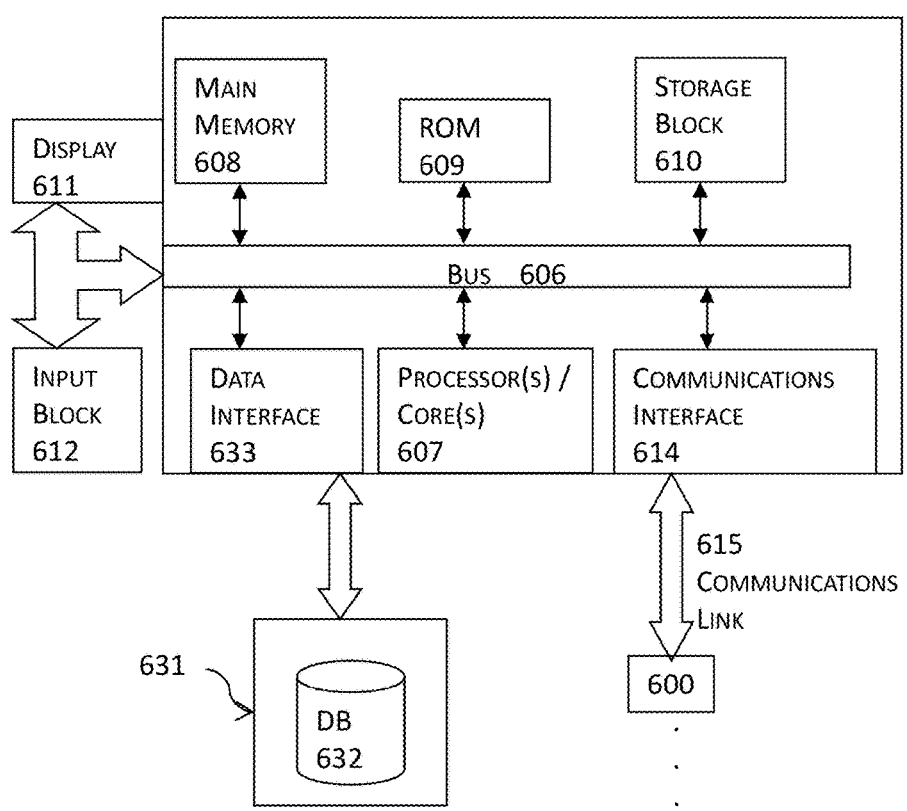
FIG. 6 illustrates a computerized system on which a method for verifying an electronic design using hierarchical clock domain crossing verification techniques may be implemented.

FIG. 6 illustrates a block diagram of an illustrative computing system 600 suitable for verifying an electronic design using hierarchical clock domain crossing verification techniques as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various acts of determination, compression, decompression, etc. may be performed by one or more modules (e.g., one or more modules described in FIG. 1) including or functioning in tandem with one or more processors, one or more processor cores, or combination thereof.

A module described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may be stored at least partially in memory and may also include or function in tandem with, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory computer accessible storage medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It may be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying an electronic design, comprising:
    performing, at one or more electronic design automation modules that are stored at least partially in memory and function in conjunction with at least one processor of at least one computing system and one or more clock domain crossing (CDC) modules, a process that comprises:
    identifying an electronic design including a hierarchical structure that further comprises a top hierarchy and one or more instances at a first child hierarchy below the top hierarchy;
    decomposing the electronic design into a top hierarchy block for the top hierarchy and one or more child blocks for the one or more instances;
    generating a plurality of data structures at least by separately processing the top hierarchy block and the one or more child blocks on one or more computing nodes;
    identifying, at the one or more CDC analysis modules, one or more clock domain crossing (CDC) structures in the electronic design at least by integrating the plurality of data structures into an integrated data structure and by performing one or more structural or clock analyses using at least the integrated data structure; and
    performing, at the one or more CDC analysis modules of the one or more electronic design automation modules, one or more verifications on the electronic design while ignoring at least one CDC structure comprising one or more circuit design components of the one or more CDC structures from the one or more verifications based at least in part upon a harmless condition.

2. The computer implemented method of claim 1, generating the plurality of data structures at least by separately processing the top hierarchy block and the one or more child blocks comprising:
    determining topology or connectivity information for the top hierarchy block at least by elaborating the top hierarchy block;
    identifying input data for the electronic design; and
    determining top hierarchy clock domain information for the top hierarchy at least by performing one or more analyses based in part or in whole upon the input data.

3. The computer implemented method of claim 1, further comprising:
    generating an elaborated top hierarchy block by elaborating the top hierarchy block while black-boxing the one or more child blocks;
    determining the topology and connectivity information for the top hierarchy of the electronic design based in part or in whole upon the elaborated top hierarchy block;
    determining the top hierarchy clock domain information at least by performing the one or more analyses on the elaborated top hierarchy block; and
    generating a top hierarchy data structure of the plurality of data structures that stores at least the topology and connectivity information and the top hierarchy clock domain information for corresponding signals or ports in the top hierarchy of the electronic design.

4. The computer implemented method of claim 1, further comprising:
    determining whether a child block in the one or more child blocks is black-boxed when the top hierarchy block is separately processed; and
    identifying one or more additional child instances in the child block from the one or more child blocks.

5. The computer implemented method of claim 4, further comprising:
    determining whether the child block is to be processed by more than one computing node;
    decomposing the child block into a plurality of sub-blocks; and
    generating a plurality of child data structures for the plurality of sub-blocks at least by separately processing the plurality of sub-blocks at the more than one computing nodes in a distributed or parallel computing paradigm.

6. The computer implemented method of claim 4, further comprising:
    generating an elaborated child block by elaborating the child block;
    determining child block topology and connectivity information for the child block in the electronic design based in part or in whole upon the elaborated child block;
    determining child block clock domain information at least by performing the one or more analyses on the elaborated child block; and
    generating a child block data structure of the plurality of data structures that stores at least the child block topology and connectivity information and the child block clock domain information for corresponding child block signals in the child block.

7. The computer implemented method of claim 6, further comprising:
    identifying top hierarchy signals in the top hierarchy and child block signals in the child block;

identifying corresponding information that respectively corresponds to the top hierarchy signals in the top hierarchy and the child block signals in the child block; and generating an integrated data structure for the electronic design in its entirety at least by merging the corresponding information for the top hierarchy signals in the top hierarchy and the child block signals in the child block to integrate the plurality of data structures into the integrated data structure.

8. The computer implemented method of claim 7, further comprising:

propagating exact clock domain information of a signal in the top hierarchy signals and child block signals to one or more other signals connected to the signal; and determining the one or more clock domain crossing (CDC) structures based in part or in whole upon results of propagating the exact clock domain information.

9. The computer implemented method of claim 6, further comprising:

classifying the exact clock domain information and speculative clock domain information in the top hierarchy clock domain information or the child block clock domain information into a plurality of classes;

identifying one or more rules based in part or in whole upon the plurality of classes for the exact clock domain information and the speculative clock domain information;

determining whether a CDC structure or a CDC signal is harmless based in part or in whole upon the one or more rules;

reducing a total number of CDC structures or CDC signals into a reduced set at least by discarding or ignoring the CDC structure or the CDC signal from further processing when the CDC structure or a CDC signal is determined to be harmless; and performing one or more fixes on the reduced set.

10. A system for verifying an electronic design, comprising:

one or more electronic design automation (EDA) modules, at least one of which is stored in part or in whole in memory and comprises at least one processor including one or more processor cores executing one or more threads in a computing system;

a non-transitory computer accessible storage medium storing thereupon program code that includes a sequence of instructions that, when executed by the at least one processor, causes the at least one processor at least to:

identify an electronic design including a hierarchical structure that further comprises a top hierarchy and one or more instances at a first child hierarchy below the top hierarchy;

decompose the electronic design into a top hierarchy block for the top hierarchy and one or more child blocks for the one or more instances;

generate a plurality of data structures at least by separately processing the top hierarchy block and the one or more child blocks on one or more computing nodes;

one or more CDC analysis modules of the one or more EDA modules configured to identify one or more clock domain crossing (CDC) structures in the electronic design at least by integrating the plurality of data structures into an integrated data structure and by driving or propagating one or more input signals belonging to the top hierarchy using at least the integrated data structure; and the one or more CDC analysis modules of the one or more electronic design automation modules further configured to perform one or more verifications on the electronic design while ignoring at least one CDC structure comprising one or more circuit design components of the one or more CDC structures from the one or more verifications based at least in part upon a harmless condition.

11. The system of claim 10, wherein the program code includes the sequence of instructions that, when executed by the at least one processor, further cause the at least one processor to:

determine topology or connectivity information for the top hierarchy block at least by elaborating the top hierarchy block;

identify input data for the electronic design; and determine top hierarchy clock domain information for the top hierarchy at least by performing one or more analyses based in part or in whole upon the input data.

12. The system of claim 10, wherein the program code includes the sequence of instructions that, when executed by the at least one processor, further cause the at least one processor to:

generate an elaborated top hierarchy block by elaborating the top hierarchy block while black-boxing the one or more child blocks;

determine the topology and connectivity information for the top hierarchy of the electronic design based in part or in whole upon the elaborated top hierarchy block;

determine the top hierarchy clock domain information at least by performing the one or more analyses on the elaborated top hierarchy block; and generate a top hierarchy data structure of the plurality of data structures that stores at least the topology and connectivity information and the top hierarchy clock domain information for corresponding signals or ports in the top hierarchy of the electronic design.

13. The system of claim 10, wherein the program code includes the sequence of instructions that, when executed by the at least one processor, further cause the at least one processor to:

determine whether a child block in the one or more child blocks is black-boxed when the top hierarchy block is separately processed; and identify one or more additional child instances in the child block from the one or more child blocks.

14. The system of claim 13, wherein the program code includes the sequence of instructions that, when executed by the at least one processor, further cause the at least one processor to:

determine whether the child block is to be processed by more than one computing node;

decompose the child block into a plurality of sub-blocks; and generate a plurality of child data structures for the plurality of sub-blocks at least by separately processing the plurality of sub-blocks at the more than one computing nodes in a distributed or parallel computing paradigm.

15. The system of claim 13, wherein the program code includes the sequence of instructions that, when executed by the at least one processor, further cause the at least one processor to:

generate an elaborated child block by elaborating the child block;

determine child block topology and connectivity information for the child block in the electronic design based in part or in whole upon the elaborated child block;

determine child block clock domain information at least by performing the one or more analyses on the elaborated child block; and generate a child block data structure of the plurality of data structures that stores at least the child block topology and connectivity information and the child block clock domain information for corresponding child block signals in the child block.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for verifying an electronic design, the set of acts comprising:

identifying an electronic design including a hierarchical structure that further comprises a top hierarchy and one or more instances at a first child hierarchy below the top hierarchy;

decomposing the electronic design into a top hierarchy block for the top hierarchy and one or more child blocks for the one or more instances;

generating a plurality of data structures at least by separately processing the top hierarchy block and the one or more child blocks on one or more computing nodes;

identifying, at one or more CDC analysis modules stored at least partially in the memory of and functioning in conjunction with the at least one processor, one or more clock domain crossing (CDC) structures in the electronic design at least by integrating the plurality of data structures into an integrated data structure and by performing one or more structural or clock analyses using at least the integrated data structure; and performing, at the one or more CDC analysis modules of the one or more electronic design automation modules, one or more verifications on the electronic design while ignoring at least one CDC structure comprising one or more circuit design components of the one or more CDC structures from the one or more verifications based at least in part upon a harmless condition.

17. The article of manufacture of claim 16, the set of acts further comprising:

determining whether a child block in the one or more child blocks is black-boxed when the top hierarchy block is separately processed; and identifying one or more additional child instances in the child block from the one or more child blocks.

18. The article of manufacture of claim 17, the set of acts further comprising:

generating an elaborated child block by elaborating the child block;

determining child block topology and connectivity information for the child block in the electronic design based in part or in whole upon the elaborated child block;

determining child block clock domain information at least by performing the one or more analyses on the elaborated child block; and generating a child block data structure of the plurality of data structures that stores at least the child block topology and connectivity information and the child block clock domain information for corresponding child block signals in the child block.

19. The article of manufacture of claim 18, the set of acts further comprising:

identifying top hierarchy signals in the top hierarchy and child block signals in the child block;

identifying corresponding information that respectively corresponds to the top hierarchy signals in the top hierarchy and the child block signals in the child block; and generating an integrated data structure for the electronic design in its entirety at least by merging the corresponding information for the top hierarchy signals in the top hierarchy and the child block signals in the child block to integrate the plurality of data structures into the integrated data structure.

20. The article of manufacture of claim 19, the set of acts further comprising:

propagating exact clock domain information of a signal in the top hierarchy signals and child block signals to one or more other signals connected to the signal; and determining the one or more clock domain crossing (CDC) structures based in part or in whole upon results of propagating the exact clock domain information.

21. The article of manufacture of claim 18, the set of acts further comprising:

classifying the exact clock domain information and speculative clock domain information in the top hierarchy clock domain information or the child block clock domain information into a plurality of classes;

identifying one or more rules based in part or in whole upon the plurality of classes for the exact clock domain information and the speculative clock domain information;

determining whether a CDC structure or a CDC signal is harmless based in part or in whole upon the one or more rules;

reducing a total number of CDC structures or CDC signals into a reduced set at least by discarding or ignoring the CDC structure or the CDC signal from further processing when the CDC structure or a CDC signal is determined to be harmless; and performing one or more fixes on the reduced set.

* * * * *